(12) United States Patent
Chang et al.

(10) Patent No.: US 9,520,474 B2
(45) Date of Patent: Dec. 13, 2016

(54) METHODS OF FORMING A SEMICONDUCTOR DEVICE WITH A GATE STACK HAVING TAPERED SIDEWALLS

(71) Applicant: Taiwan Semiconductor Manufacturing Company Limited, Hsin-Chu (TW)

(72) Inventors: Che-Cheng Chang, New Taipei (TW); Chang-Yin Chen, Taipei (TW); Yi-Jen Chen, Hsinchu (TW); Yung Jung Chang, Cyonglin Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 419 days.

(21) Appl. No.: 14/024,848

(22) Filed: Sep. 12, 2013

(65) Prior Publication Data
US 2015/0069535 A1   Mar. 12, 2015

(51) Int. Cl.
| | | |
|---|---|---|
| *H01L 21/28* | (2006.01) | |
| *H01L 29/423* | (2006.01) | |
| *H01L 29/66* | (2006.01) | |
| *H01L 21/311* | (2006.01) | |
| *H01L 21/3213* | (2006.01) | |
| *H01L 29/78* | (2006.01) | |
| *H01L 29/51* | (2006.01) | |

(52) U.S. Cl.
CPC ... *H01L 29/42376* (2013.01); *H01L 21/28114* (2013.01); *H01L 21/31116* (2013.01); *H01L 21/31138* (2013.01); *H01L 21/32137* (2013.01); *H01L 29/66545* (2013.01); *H01L 29/517* (2013.01); *H01L 29/78* (2013.01)

(58) Field of Classification Search
CPC .... H01L 21/265; H01L 21/28; H01L 21/3205; H01L 21/336; H01L 21/8238; H01L 21/338; H01L 29/76; H01L 29/78; H01L 27/092
USPC ........ 257/412, 346, 387, 369; 438/302, 591, 438/285, 287, 283, 303, 301
See application file for complete search history.

(56) References Cited

U.S. PATENT DOCUMENTS

| | | | | |
|---|---|---|---|---|
| 6,107,148 A | * | 8/2000 | Taki ...................... | H01L 21/266 257/E21.346 |
| 6,475,841 B1 | * | 11/2002 | Taylor, Jr. ......... | H01L 21/26586 257/E21.205 |
| 7,208,361 B2 | * | 4/2007 | Shah ...................... | H01L 21/84 257/204 |
| 7,595,248 B2 | * | 9/2009 | Hattendorf ........ | H01L 21/26586 257/E21.248 |
| 7,915,127 B2 | * | 3/2011 | Lin .................... | H01L 29/66545 257/E21.476 |
| 8,765,537 B2 | * | 7/2014 | Ng .................... | H01L 21/28114 257/E21.44 |

(Continued)

*Primary Examiner* — Marc Armand
*Assistant Examiner* — Younes Boulghassoul
(74) *Attorney, Agent, or Firm* — Cooper Legal Group, LLC

(57) ABSTRACT

A semiconductor device includes a metal gate stack. The metal gate stack includes a high-k gate dielectric and a metal gate electrode over the high-k gate dielectric. The metal gate electrode includes a first top surface and a second bottom surface substantially diametrically opposite the first top surface. The first top surface includes a first surface length and the second bottom surface includes a second surface length. The first surface length is larger than the second surface length. A method of forming a semiconductor device is provided.

20 Claims, 25 Drawing Sheets

(56) References Cited

U.S. PATENT DOCUMENTS

| | | | | |
|---|---|---|---|---|
| 2003/0227055 A1* | 12/2003 | Bae | H01L 21/26586 | 257/346 |
| 2006/0046401 A1* | 3/2006 | Kavalieros | H01L 21/28114 | 438/283 |
| 2009/0061634 A1* | 3/2009 | Feurprier | H01L 21/31144 | 438/700 |
| 2009/0218640 A1* | 9/2009 | Hampp | H01L 21/28518 | 257/412 |
| 2010/0301421 A1* | 12/2010 | Kronholz | H01L 21/28088 | 257/369 |
| 2013/0043517 A1* | 2/2013 | Yin | H01L 21/28114 | 257/288 |
| 2013/0119487 A1* | 5/2013 | Lin | H01L 21/0206 | 257/412 |
| 2013/0146993 A1* | 6/2013 | Chang | H01L 21/28114 | 257/412 |

* cited by examiner

US 9,520,474 B2

1

METHODS OF FORMING A SEMICONDUCTOR DEVICE WITH A GATE STACK HAVING TAPERED SIDEWALLS

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor device are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

2

Figure 13:
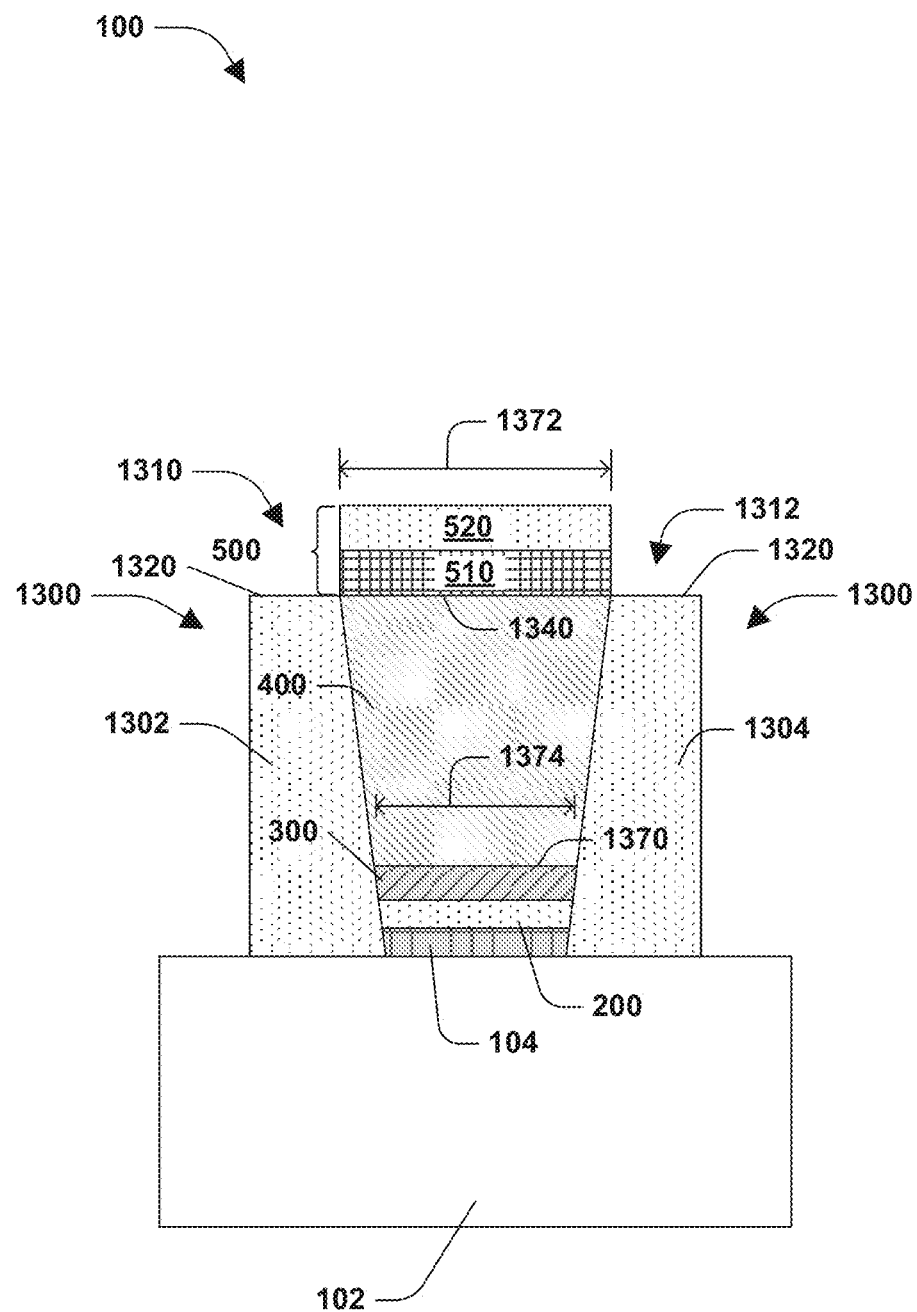
Figure 14:
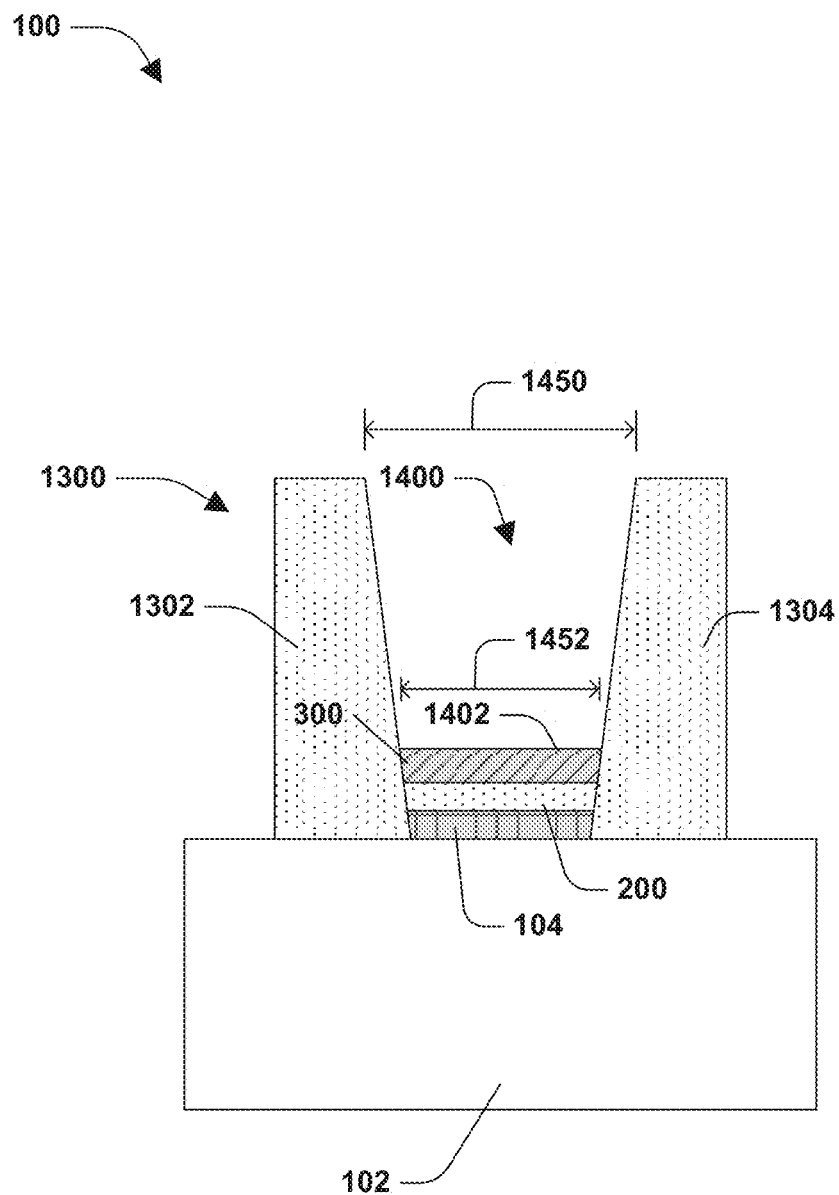
Figure 15:
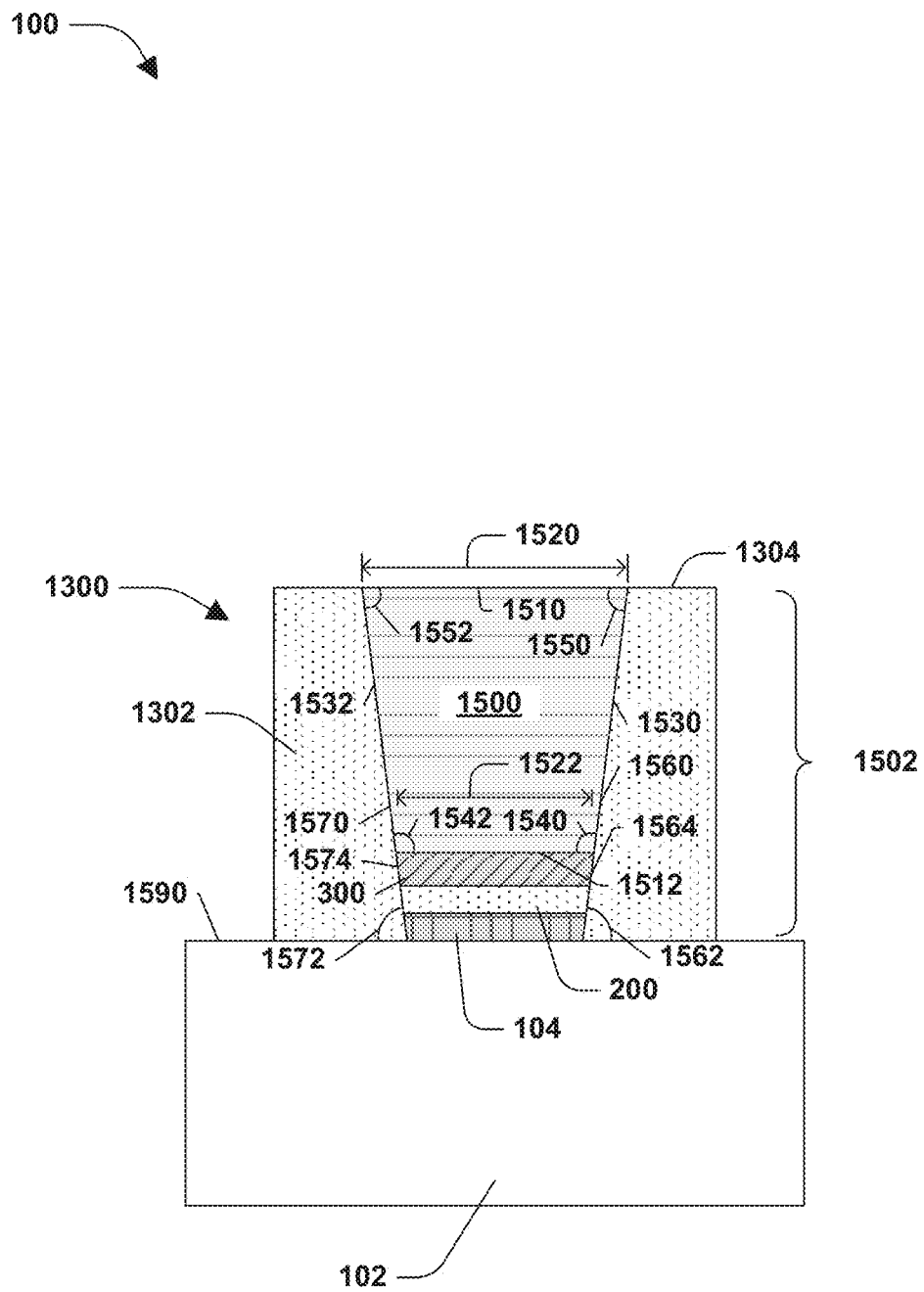
Figure 16:
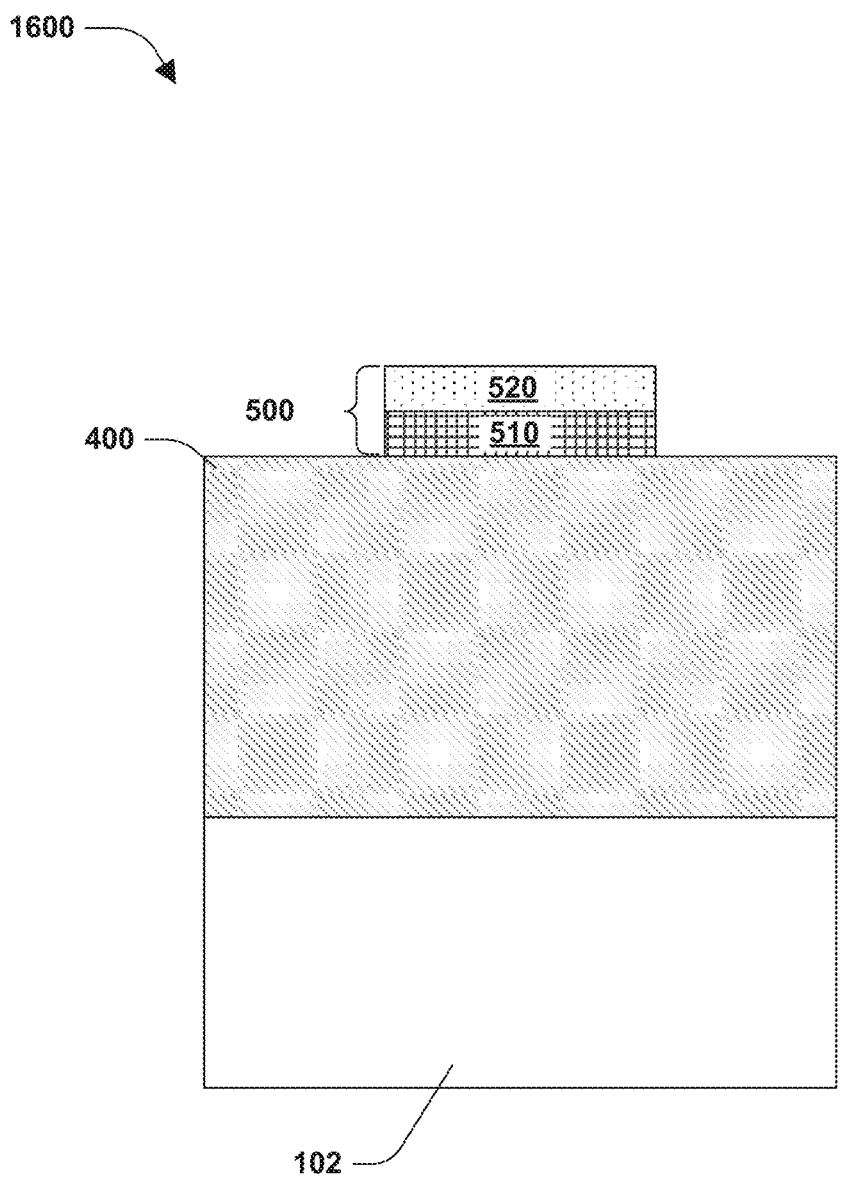
Figure 17:
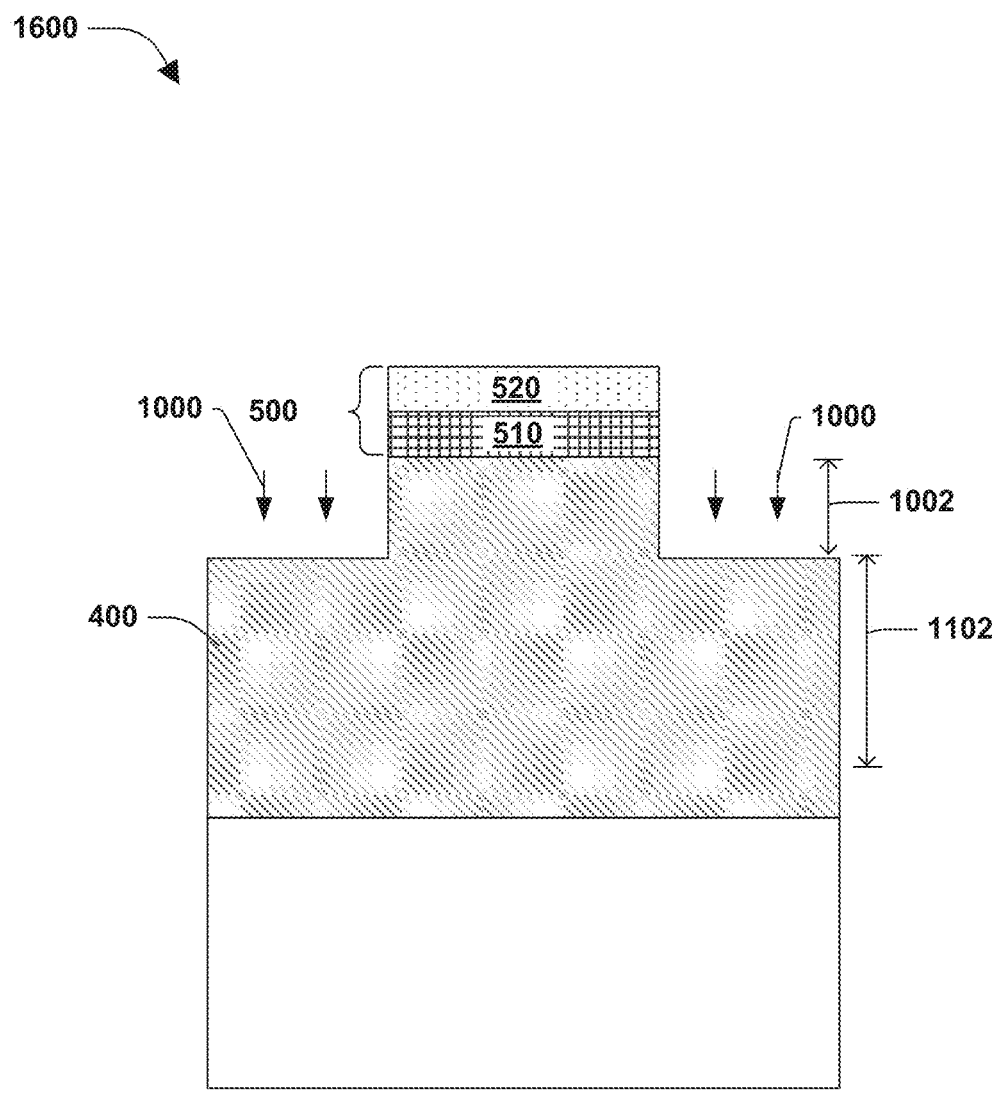
Figure 18:
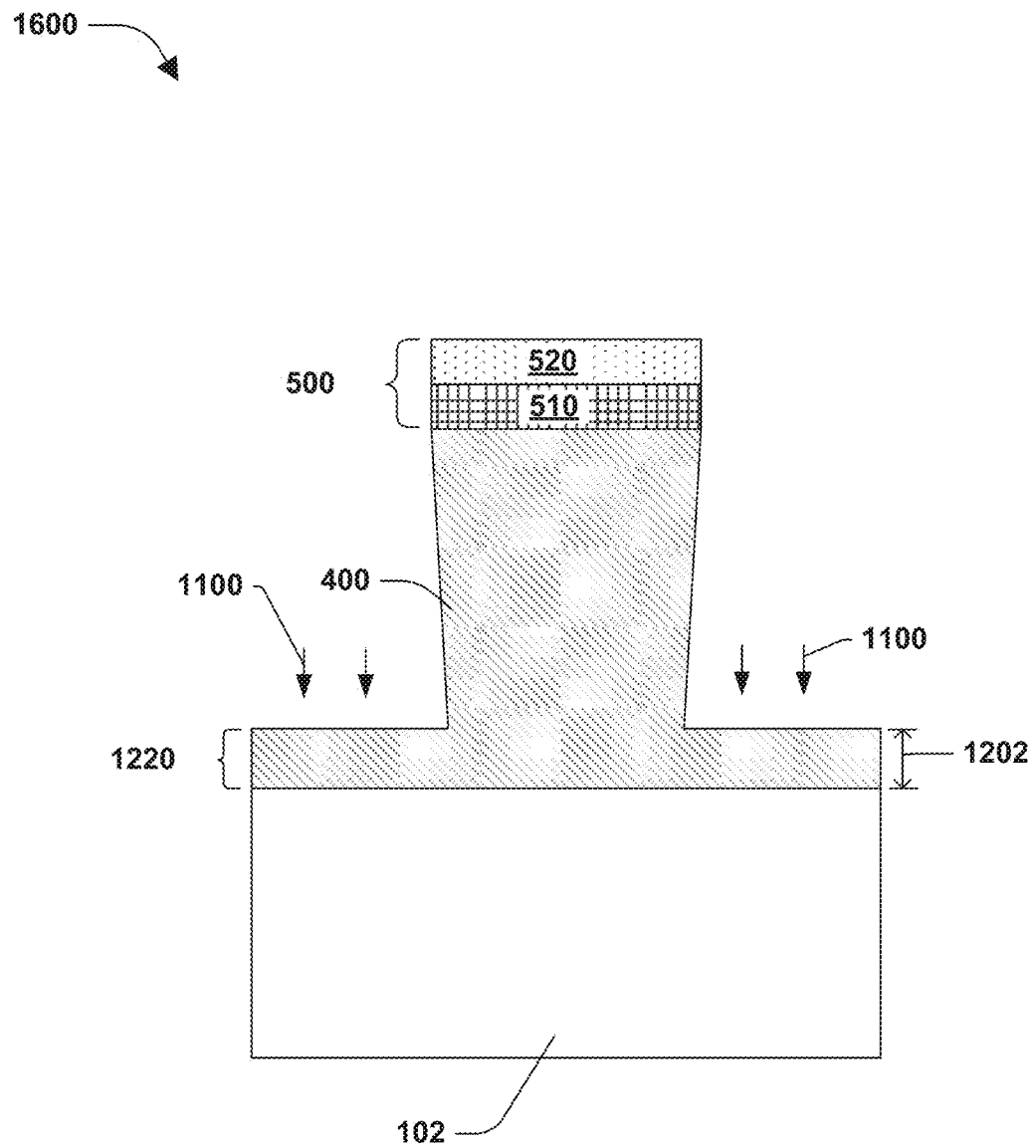
Figure 19:
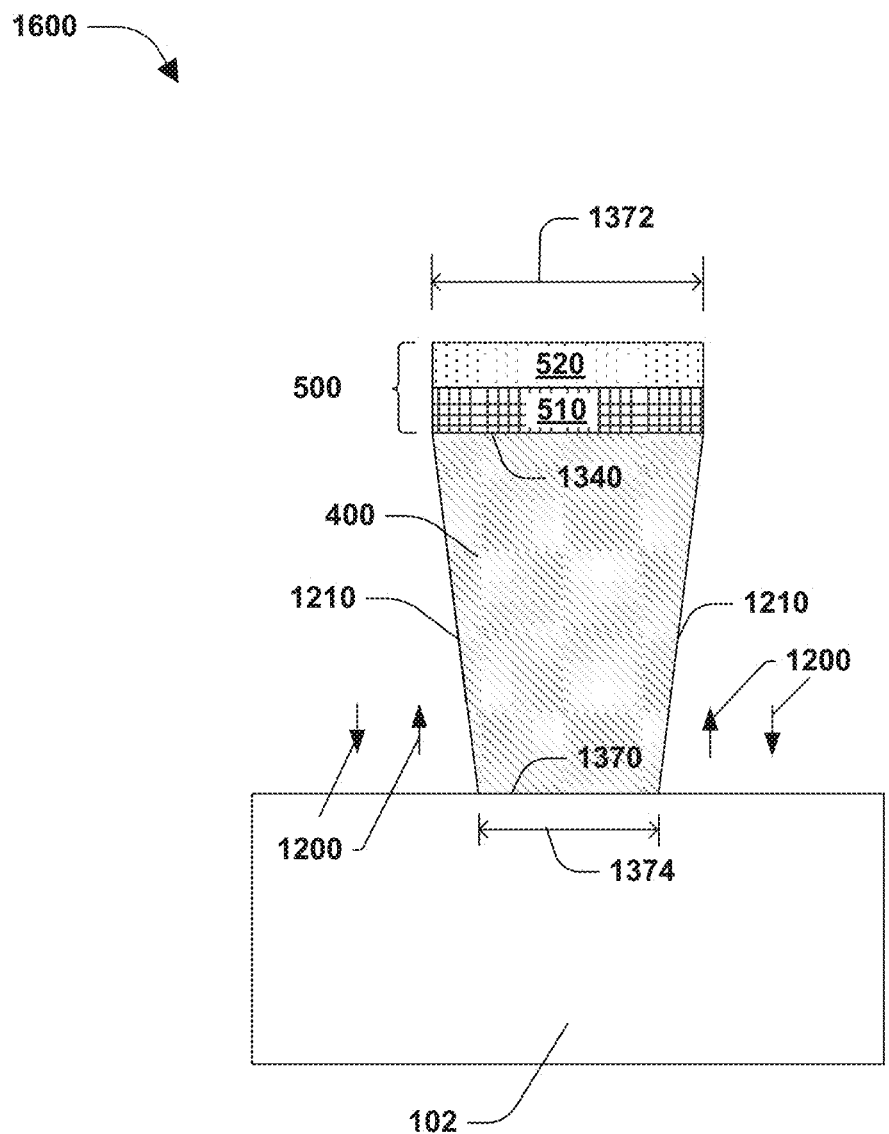
Figure 20:
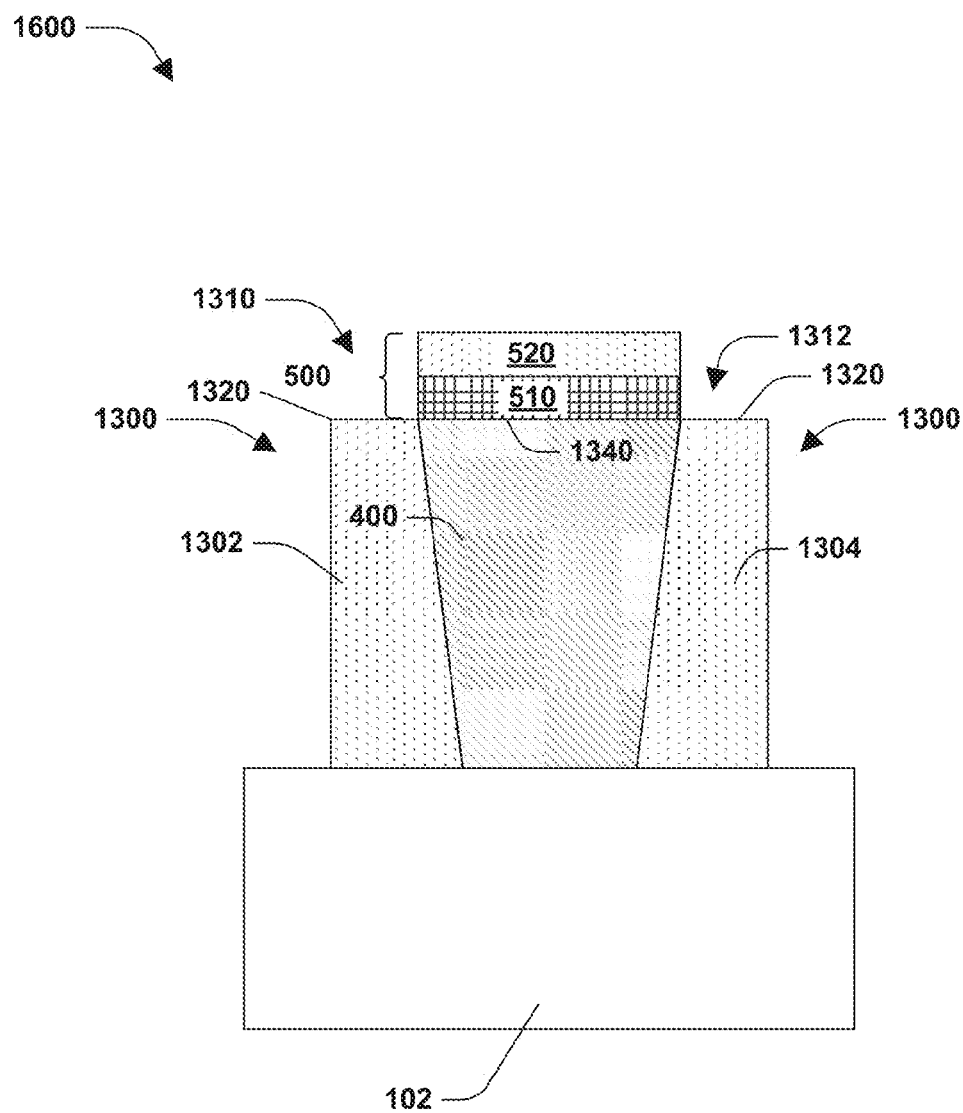
Figure 21:
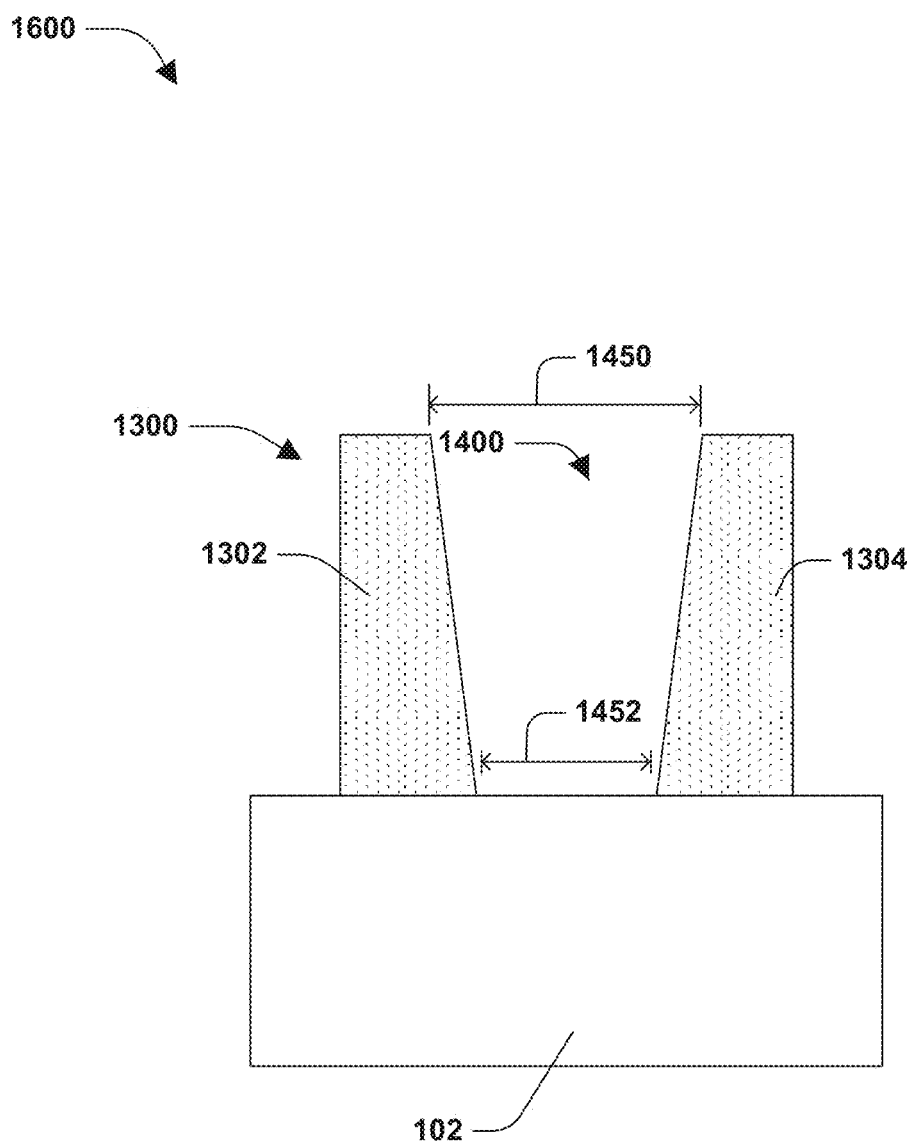
Figure 22:
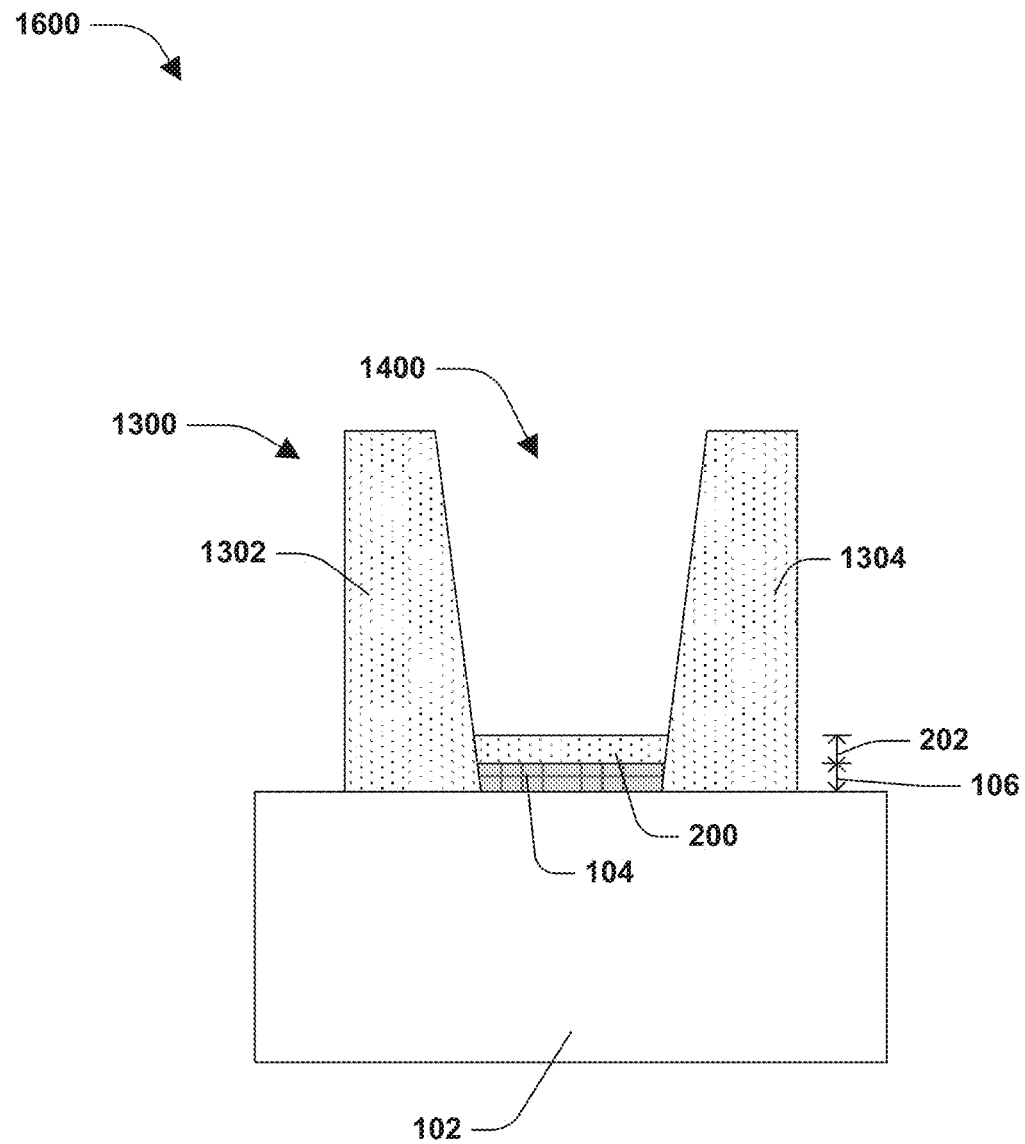
Figure 23:
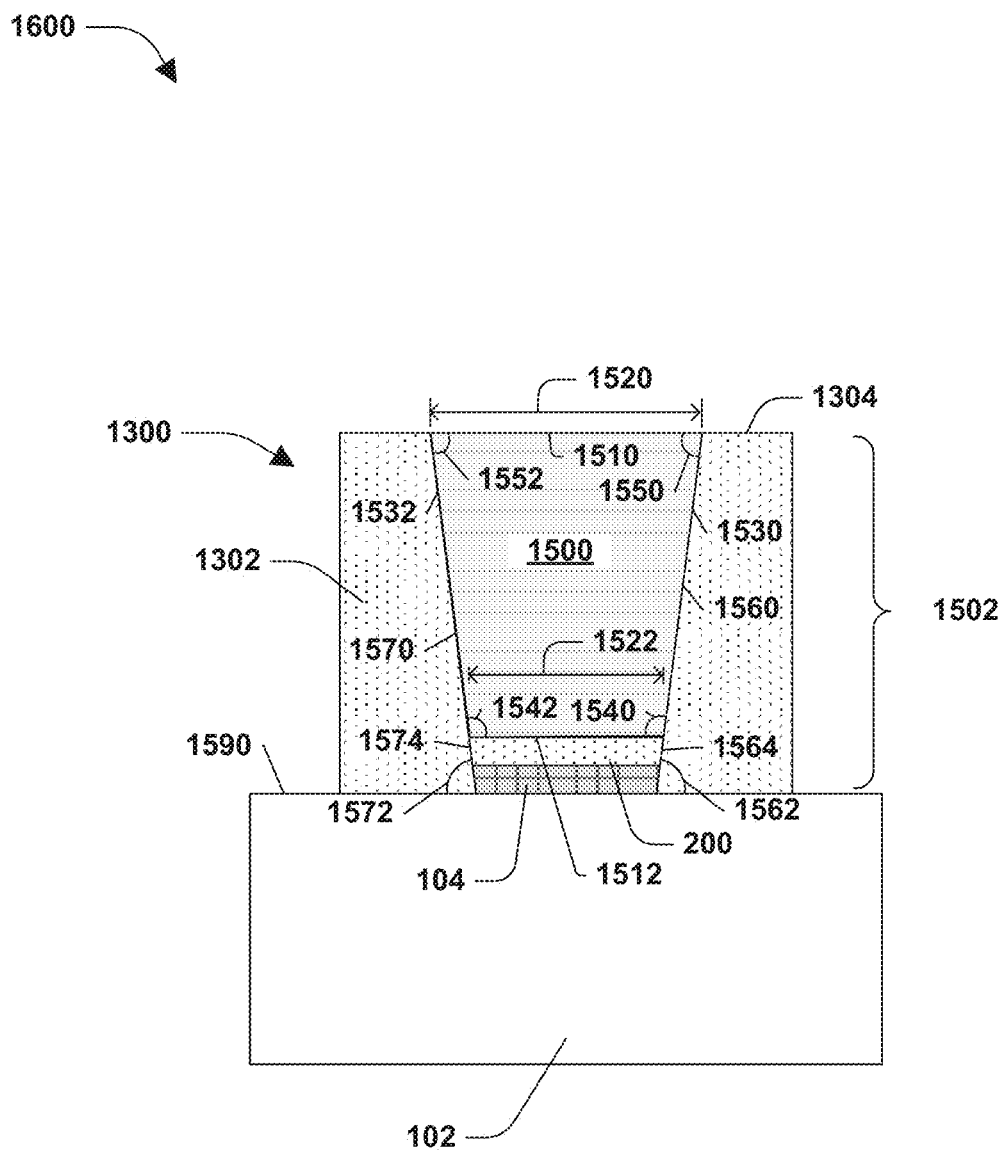
Figure 24:
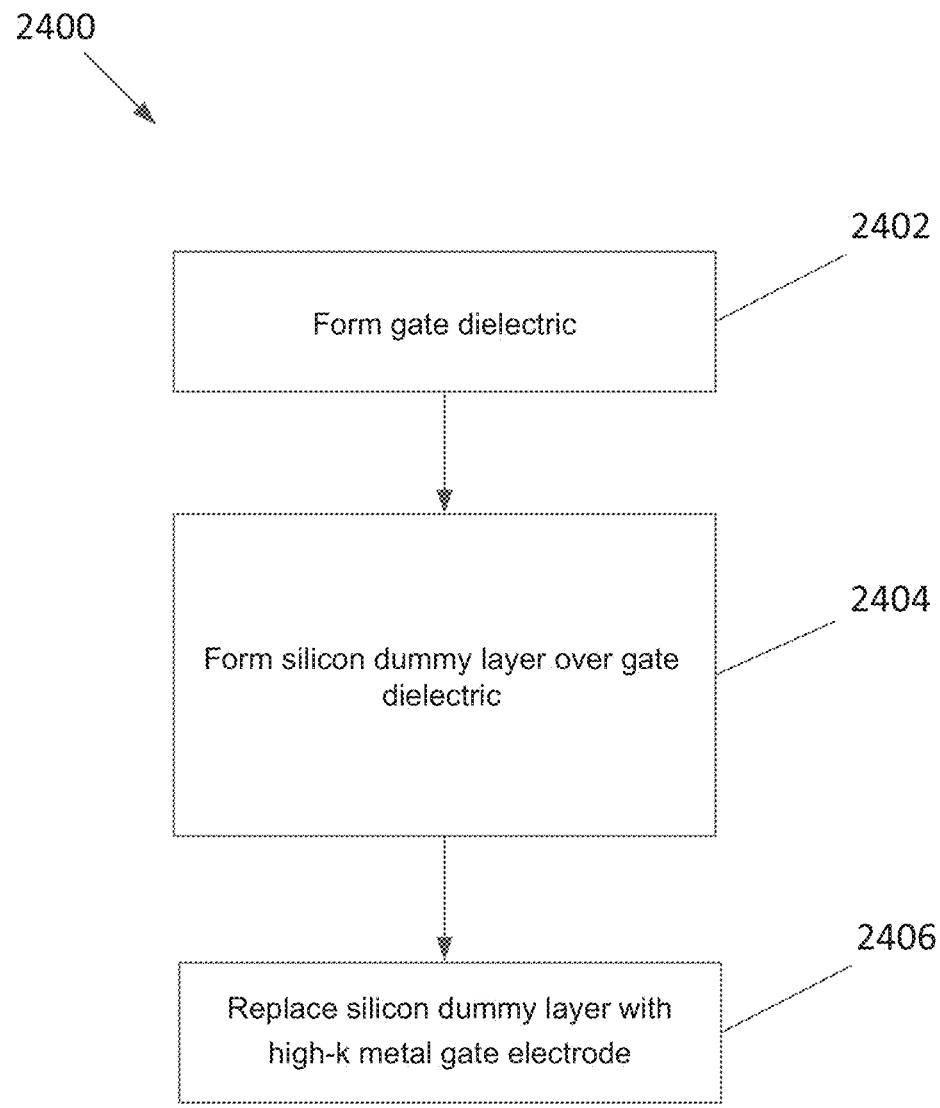
Figure 25:
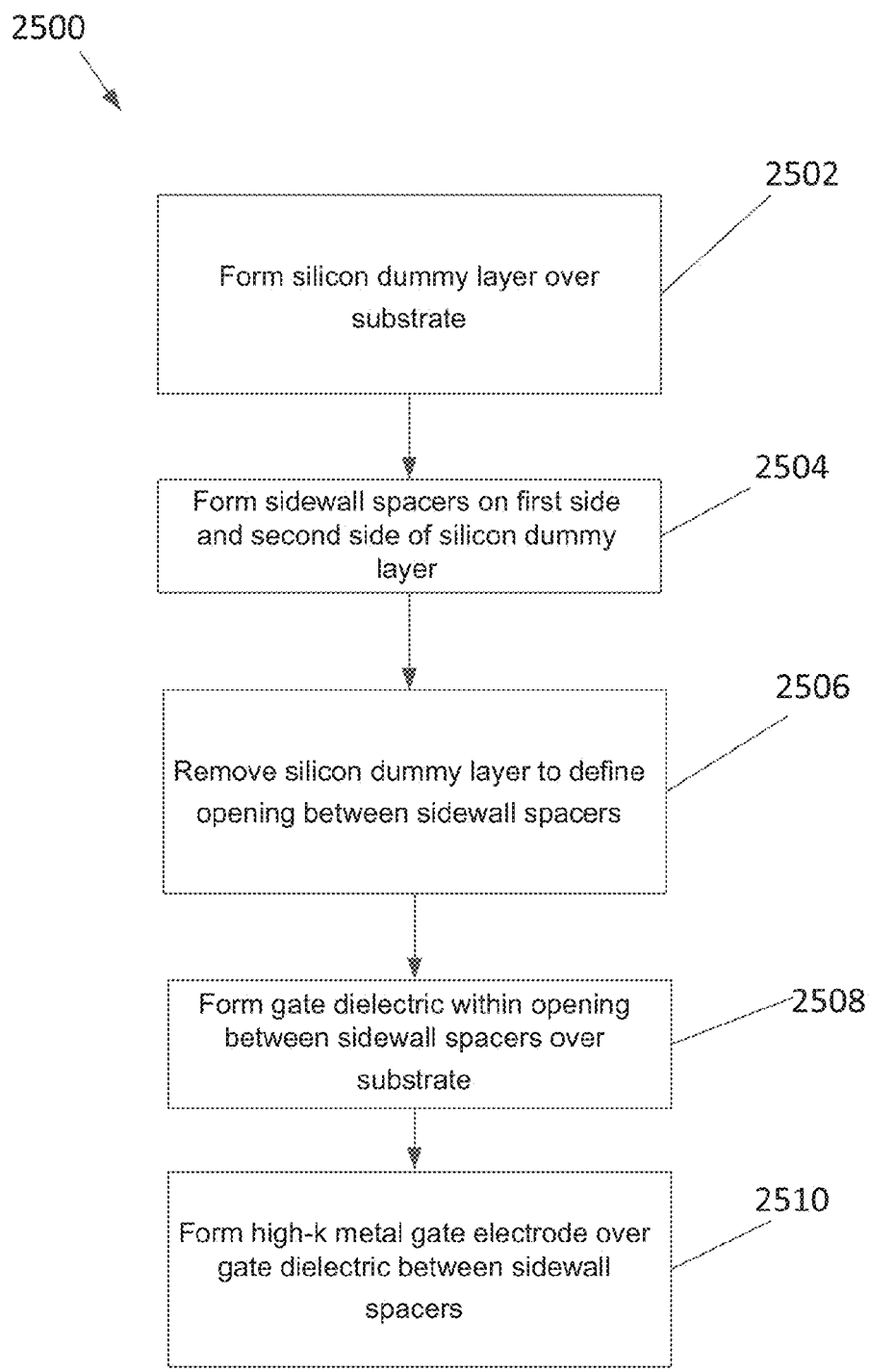

FIG. 13 illustrates a portion of a semiconductor device, according to an embodiment;

FIG. 14 illustrates a portion of a semiconductor device, according to an embodiment;

FIG. 15 illustrates forming a gate electrode associated with forming a semiconductor device, according to an embodiment;

FIG. 16 illustrates a portion of a semiconductor device, according to an embodiment;

FIG. 17 illustrates a portion of a semiconductor device, according to an embodiment;

FIG. 18 illustrates a portion of a semiconductor device, according to an embodiment;

FIG. 19 illustrates a portion of a semiconductor device, according to an embodiment;

FIG. 20 illustrates a portion of a semiconductor device, according to an embodiment;

FIG. 21 illustrates a portion of a semiconductor device, according to an embodiment;

FIG. 22 illustrates forming a gate dielectric associated with forming a semiconductor device, according to an embodiment;

FIG. 23 illustrates forming a gate electrode associated with forming a semiconductor device, according to an embodiment;

FIG. 24 illustrates a method of forming a semiconductor device, according to an embodiment; and FIG. 25 illustrates a method of forming a semiconductor device, according to an embodiment.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor device and resulting structures formed thereby are provided herein.

Figure 1:
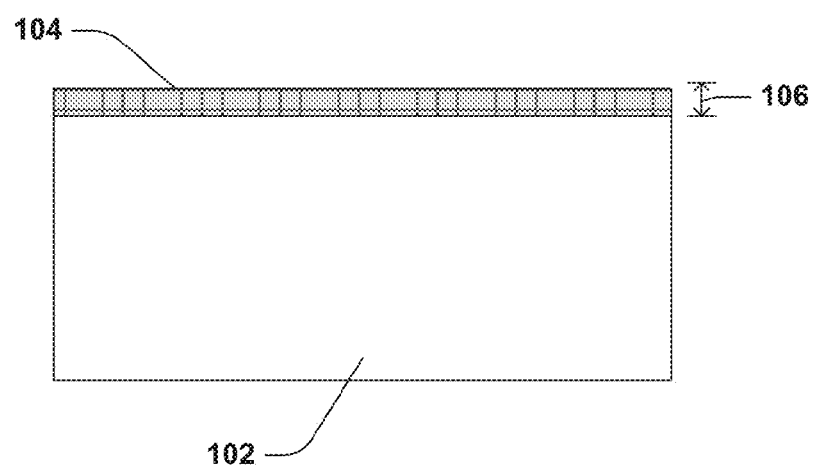
FIG. 1 illustrates a portion of a semiconductor device, according to an embodiment.

FIG. 1 is a sectional view illustrating a semiconductor device 100 according to some embodiments. In an embodiment, the semiconductor device 100 is formed upon a substrate 102. The substrate 102 comprises any number of materials, such as, for example, silicon, polysilicon, germanium, etc., alone or in combination. According to some embodiments, the substrate 102 comprises an epitaxial layer, a silicon-on-insulator (SOI) structure, etc. According to some embodiments, the substrate 102 corresponds to a wafer or a die formed from a wafer.

According to some embodiments, an interfacial layer 104 is formed over the substrate 102. The interfacial layer 104 includes any number of materials, including oxides, silicon oxide, etc. In some embodiments, an interfacial layer thickness 106 of the interfacial layer 104 is between about 5 angstroms to about 20 angstroms. The interfacial layer 104 is formed in any number of ways, such as by atomic layer deposition (ALD), chemical vapor deposition (CVD), other suitable processes, etc.

Figure 2:
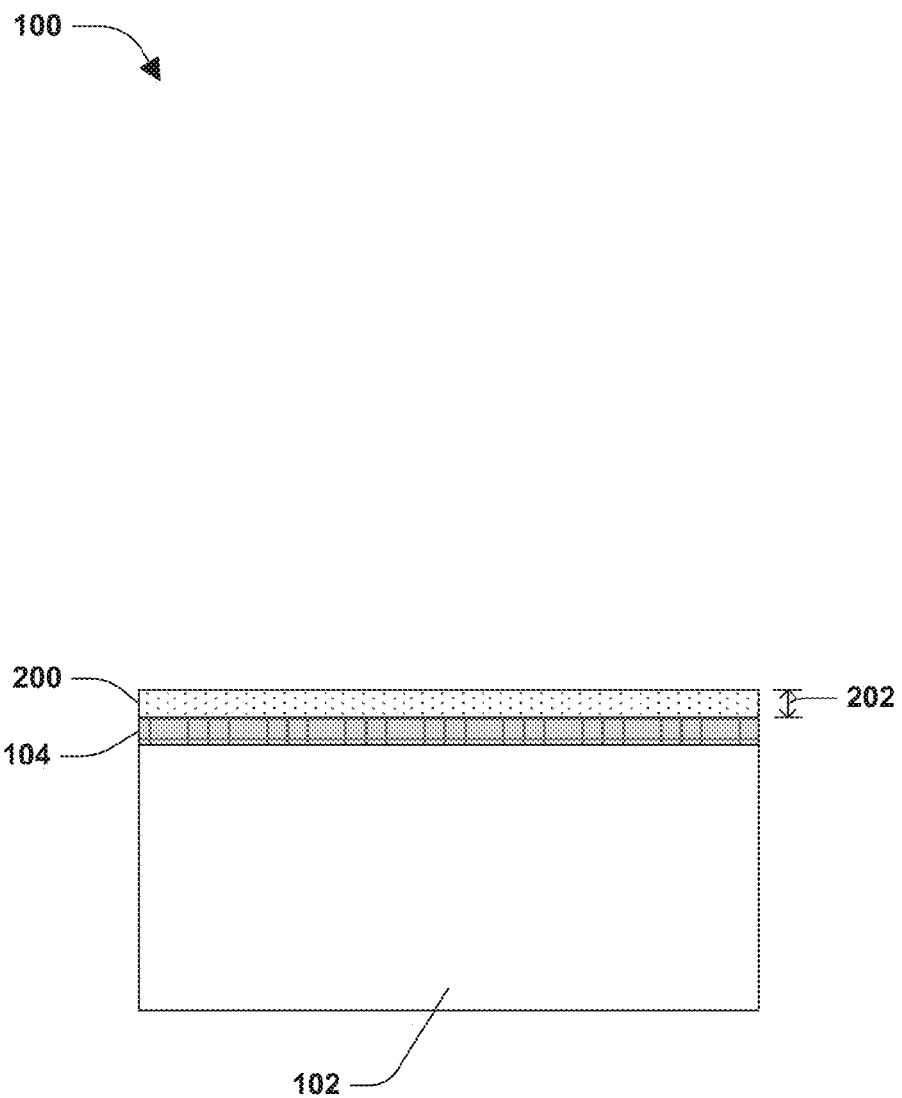
FIG. 2 illustrates forming a gate dielectric associated with forming a semiconductor device, according to an embodiment.

Turning to FIG. 2, a gate dielectric 200 is formed over the interfacial layer 104. The gate dielectric 200 comprises any number of materials, including, for example, oxides, silicon dioxide, $Al_2O_3$, HfO, $HfO_2$, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfSiO, HfTaO, HfSiO, SrTiO, ZrSiON, HfZrTiO, HfZrSiON, HfZrLaO, HfZrAlO, or combinations thereof, etc., alone or in combination. In some embodiments, the gate dielectric comprises a high-k gate dielectric. In some embodiments, a gate dielectric thickness 202 of the gate dielectric 200 is between about 5 angstroms to about 30 angstroms. The gate dielectric 200 is formed in any number of ways, such as by deposition, chemical vapor deposition (CVD), or other suitable processes, for example.

Figure 3:
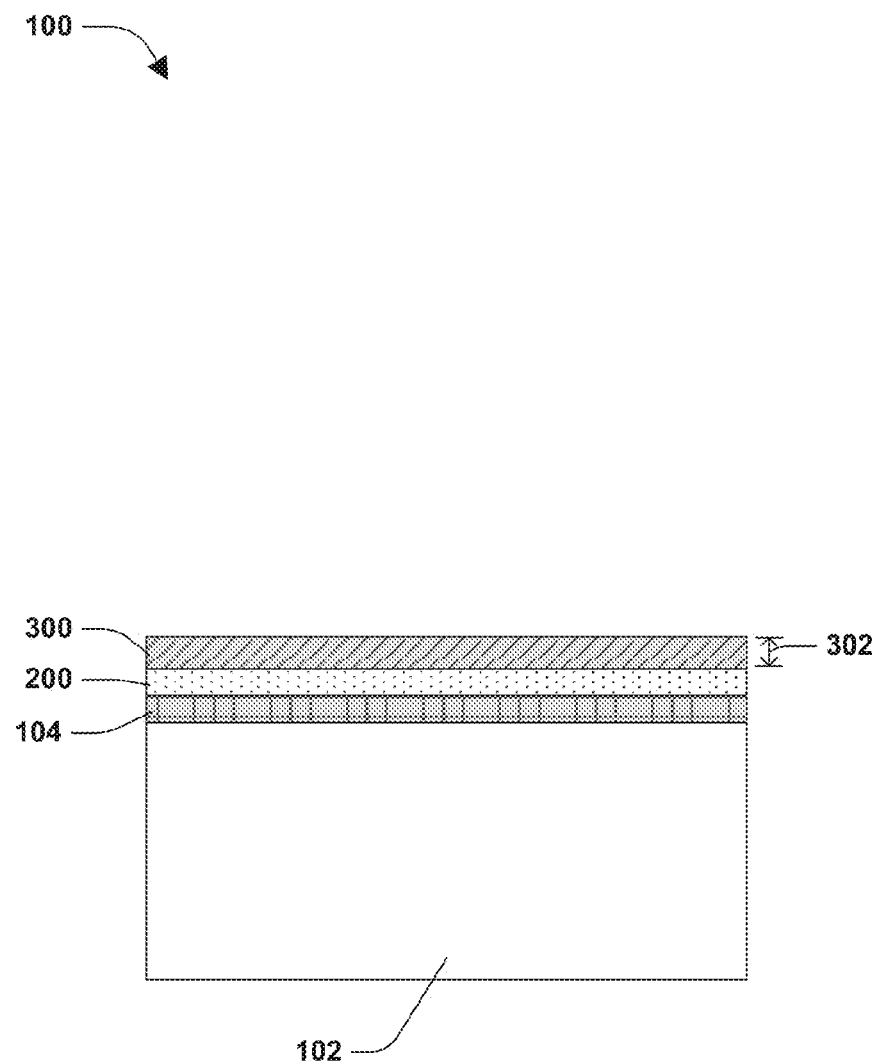
FIG. 3 illustrates a portion of a semiconductor device, according to an embodiment.

Turning now to FIG. 3, a cap layer 300 is formed over the gate dielectric 200. The cap layer 300 comprises any number of materials, including, for example, gold, tin, silver, TiN, etc. In some embodiments, a cap layer thickness 302 of the cap layer 300 is between about 5 angstroms to about 30 angstroms. The cap layer 300 is formed in any number of ways, such as by deposition, chemical vapor deposition (CVD), or other suitable processes, for example. In some embodiments, the cap layer 300 is an etch stop layer.

Figure 4:
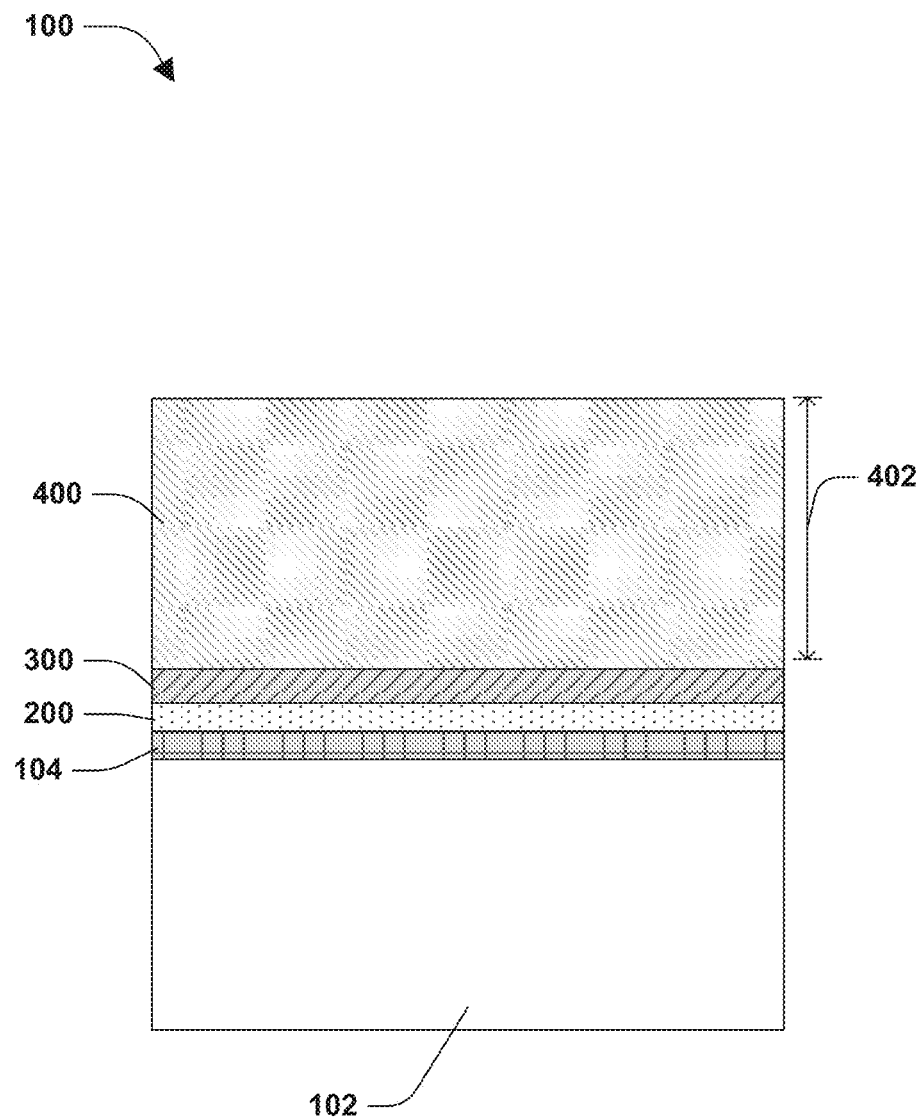
FIG. 4 illustrates a portion of a semiconductor device, according to an embodiment.

Turning now to FIG. 4, in an embodiment, a dummy layer 400 is formed over the cap layer 300 and over the substrate 102. In some embodiments, the dummy layer 400 comprises silicon, polysilicon, other semiconductor materials, etc. The dummy layer 400 is formed in any number of ways, such as by deposition and patterning, for example. According to some embodiments, a dummy layer thickness 402 of the dummy layer 400 is between about 700 angstroms to about 900 angstroms.

Figure 5:
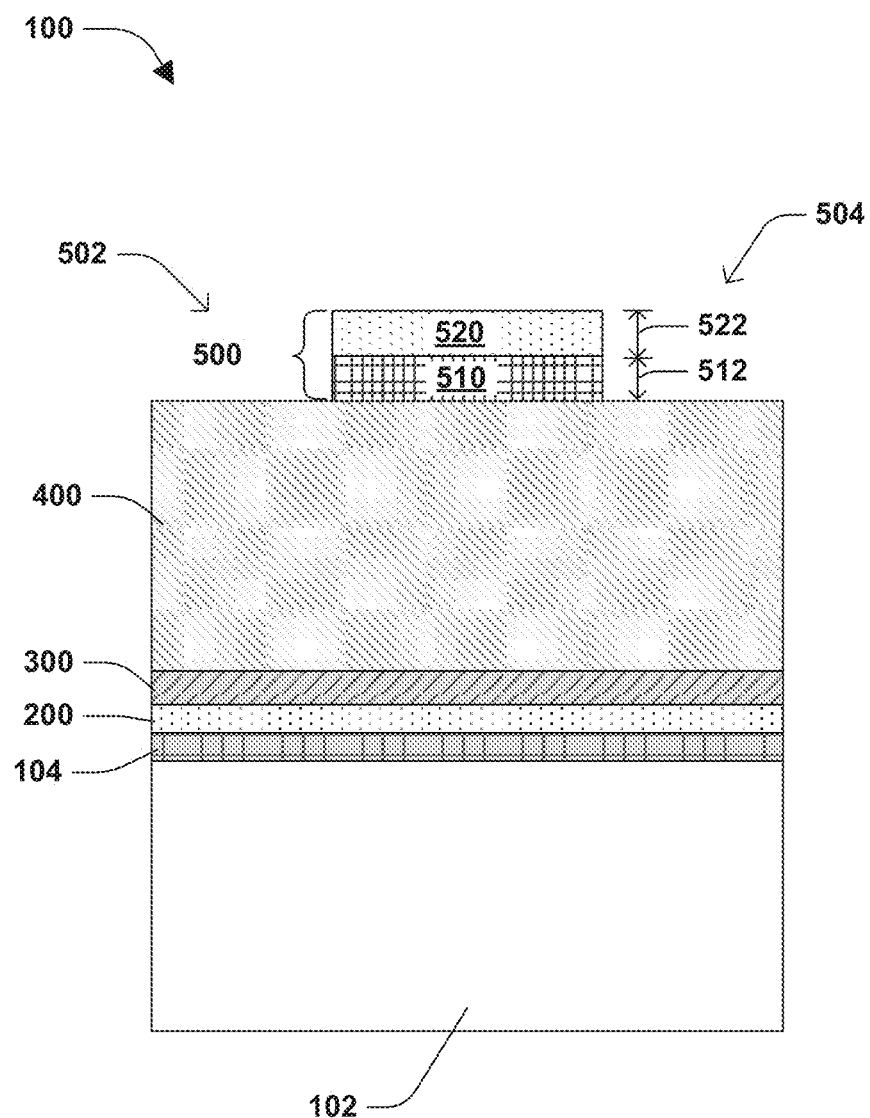
FIG. 5 illustrates a portion of a semiconductor device, according to an embodiment.

Turning now to FIG. 5, in an embodiment, a mask region 500 is formed over the dummy layer 400. The mask region 500 includes any number of materials, including silicon oxide, silicon nitride, nitride, $Si_3N_4$, etc., alone or in combination. In some embodiments, the mask region 500 is patterned to form a first opening 502 and a second opening 504 on sides of the mask region 500.

In an embodiment, the mask region 500 comprises a first mask portion 510 formed over the dummy layer 400. The first mask portion 510 includes any number of materials, including SiN, in an embodiment. In some embodiments, a first mask thickness 512 of the first mask portion 510 is between about 50 angstroms to about 150 angstroms.

In an embodiment, the mask region 500 comprises a second mask portion 520 formed over the first mask portion 510. The second mask portion 520 includes any number of materials, including oxides, plasma enhanced oxygen (PEOX), etc., in an embodiment. In some embodiments, a second mask thickness 522 of the second mask portion 520 is between about 500 angstroms to about 600 angstroms.

Figure 6:
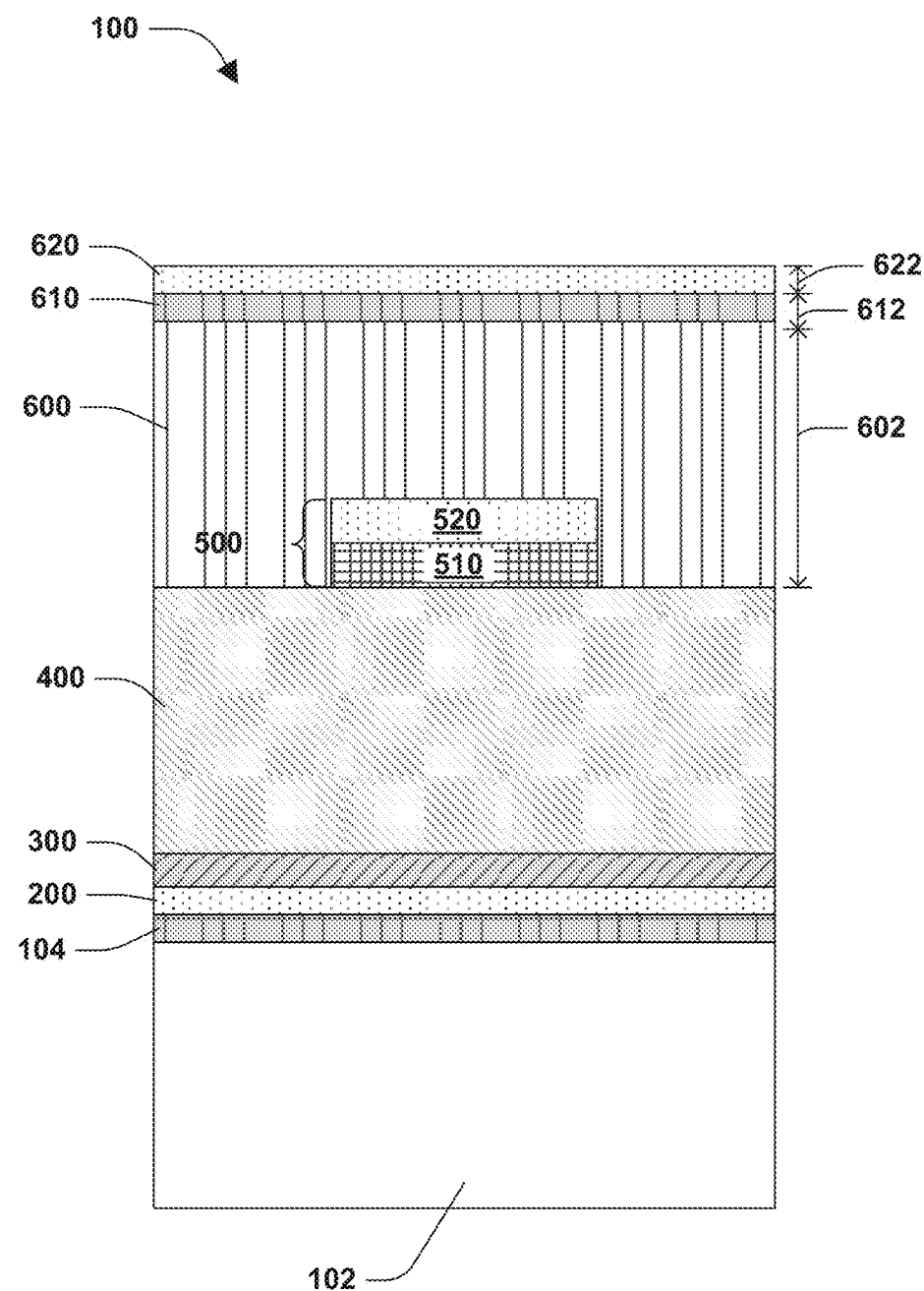
FIG. 6 illustrates a portion of a semiconductor device, according to an embodiment.

Turning now to FIG. 6, in some embodiments, a bottom layer 600 is formed over the dummy layer 400 and mask region 500. In some embodiments, the bottom layer 600 includes a photoresist material. The bottom layer 600 is formed in any number of ways, such as by deposition, for example. In some embodiments, a bottom layer thickness 602 of the bottom layer 600 is between about 1500 angstroms to about 2500 angstroms.

In some embodiments, a bottom anti-reflective coating (BARC) layer 610 is formed over the bottom layer 600. The BARC layer 610 includes any number of materials, including silicon, other semiconductor materials, etc. In an embodiment, a BARC layer thickness 612 of the BARC layer 610 is between about 700 angstroms to about 900 angstroms.

In some embodiments, a photoresist layer 620 is formed over the BARC layer 610. The photoresist layer 620 includes any number of photoresist materials. In an embodiment, a photoresist layer thickness 622 of the photoresist layer 620 is between about 1000 angstroms to about 1200 angstroms.

Figure 7:
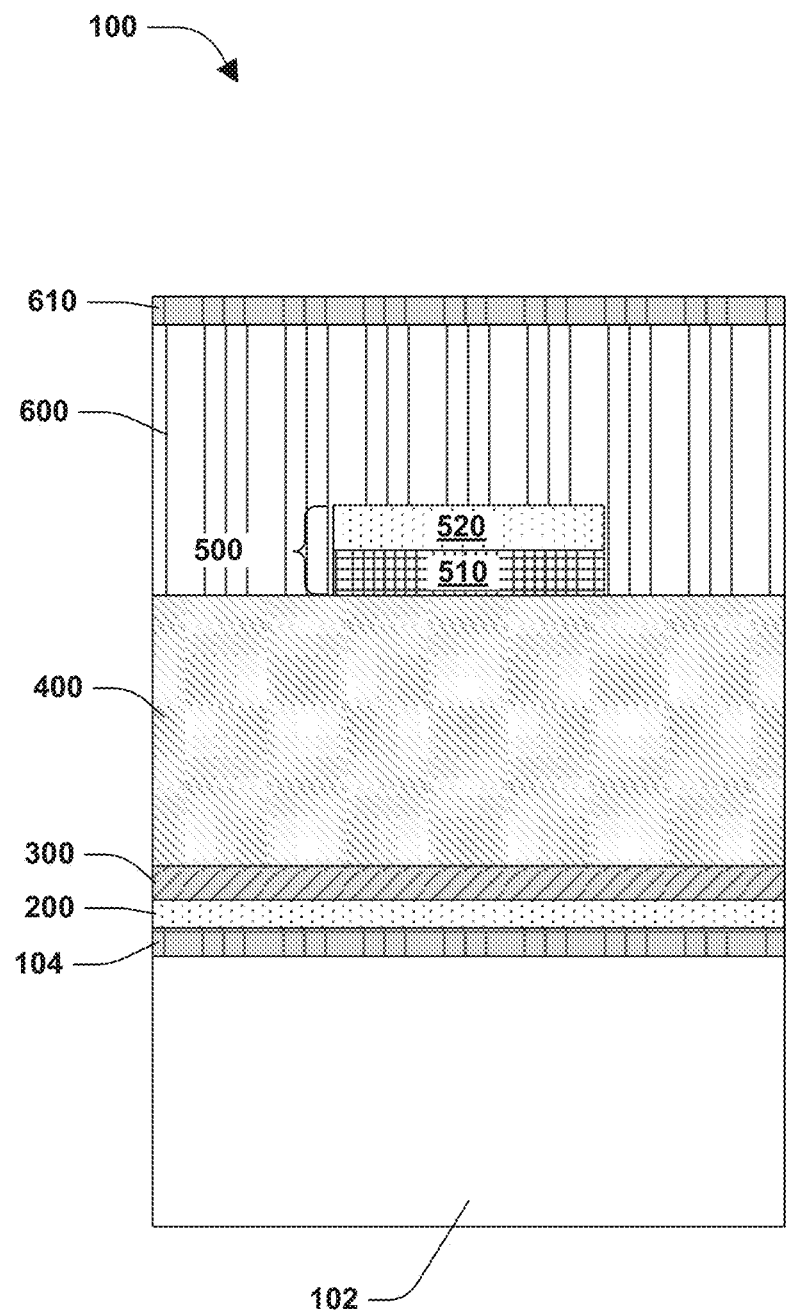
FIG. 7 illustrates a portion of a semiconductor device, according to an embodiment.

Turning now to FIG. 7, in some embodiments, the photoresist layer 620 is removed, such as by wet etching, dry etching, etc. According to some embodiments, an etch chemistry for etching through the photoresist layer 620 includes $Cl_2$, $O_2$, $H_2$, $Ch_4$, $CF_4$, Ar, He, $CHF_3$, $SF_6$, etc., alone or in combination. In some embodiments, the etch chemistry for etching through the photoresist layer 620 includes $CHF_3$ and $SF_6$ for a time period of between about 1 second to about 100 seconds at a temperature of about 60° Celsius.

Figure 8:
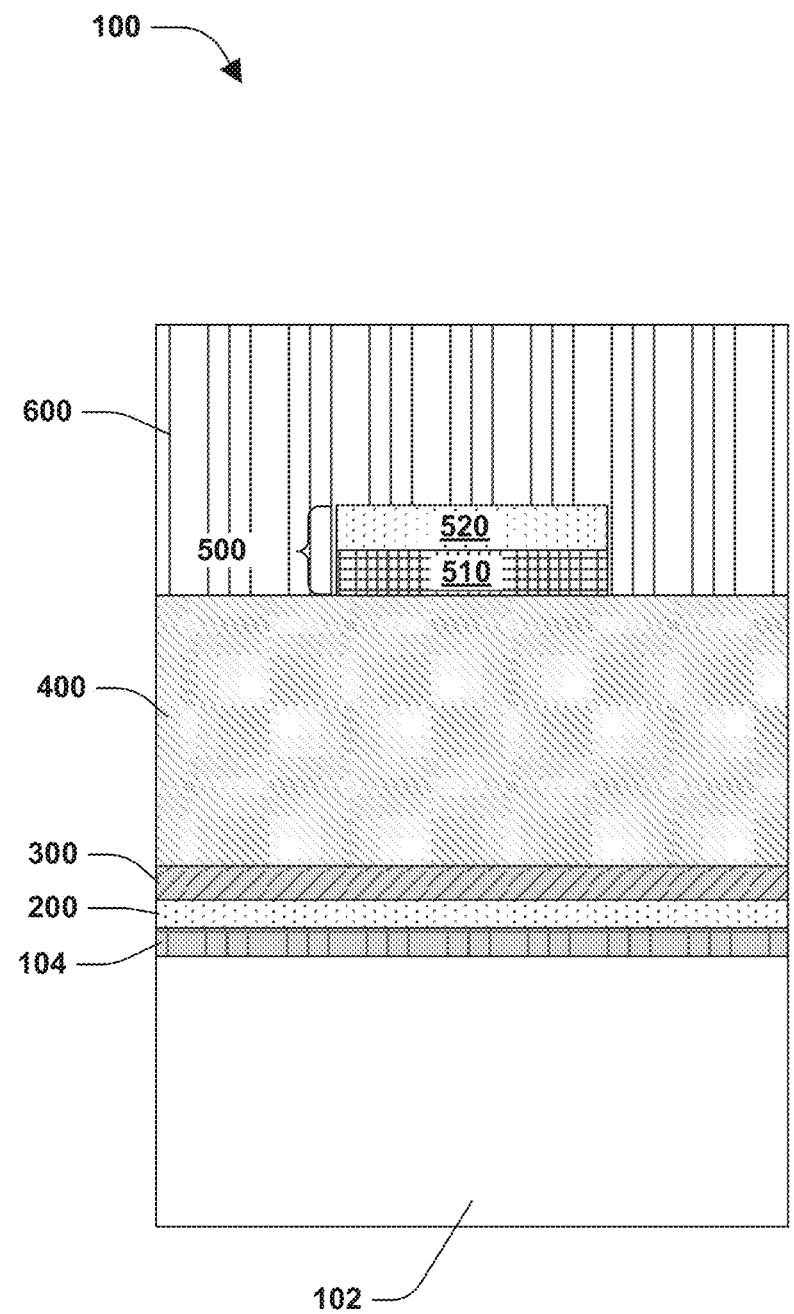
FIG. 8 illustrates a portion of a semiconductor device, according to an embodiment.

Turning now to FIG. 8, in some embodiments, the BARC layer 610 is removed, such as by wet etching, dry etching, etc. In some embodiments, the BARC layer 610 is removed after etching through the photoresist layer 620. According to some embodiments, an etch chemistry for etching through the BARC layer 610 includes $CF_4$, $CHF_3$, $CH_2F_2$, $SF_6$, $O_2$, $N_2$, Ar, He, $Cl_2$, etc., alone or in combination. In some embodiments, an etching time for etching through the BARC layer 610 is between about 1 second to about 100 seconds. In some embodiments, an etch pressure for etching through the BARC layer 610 is between about 1 millitorr (mTorr) to about 30 mTorr. In some embodiments, a source wattage for etching through the BARC layer 610 is between about 100 watts to about 2000 watts. In some embodiments, a bias wattage for etching through the BARC layer 610 is between about 0 watts to about 800 watts.

Figure 9:
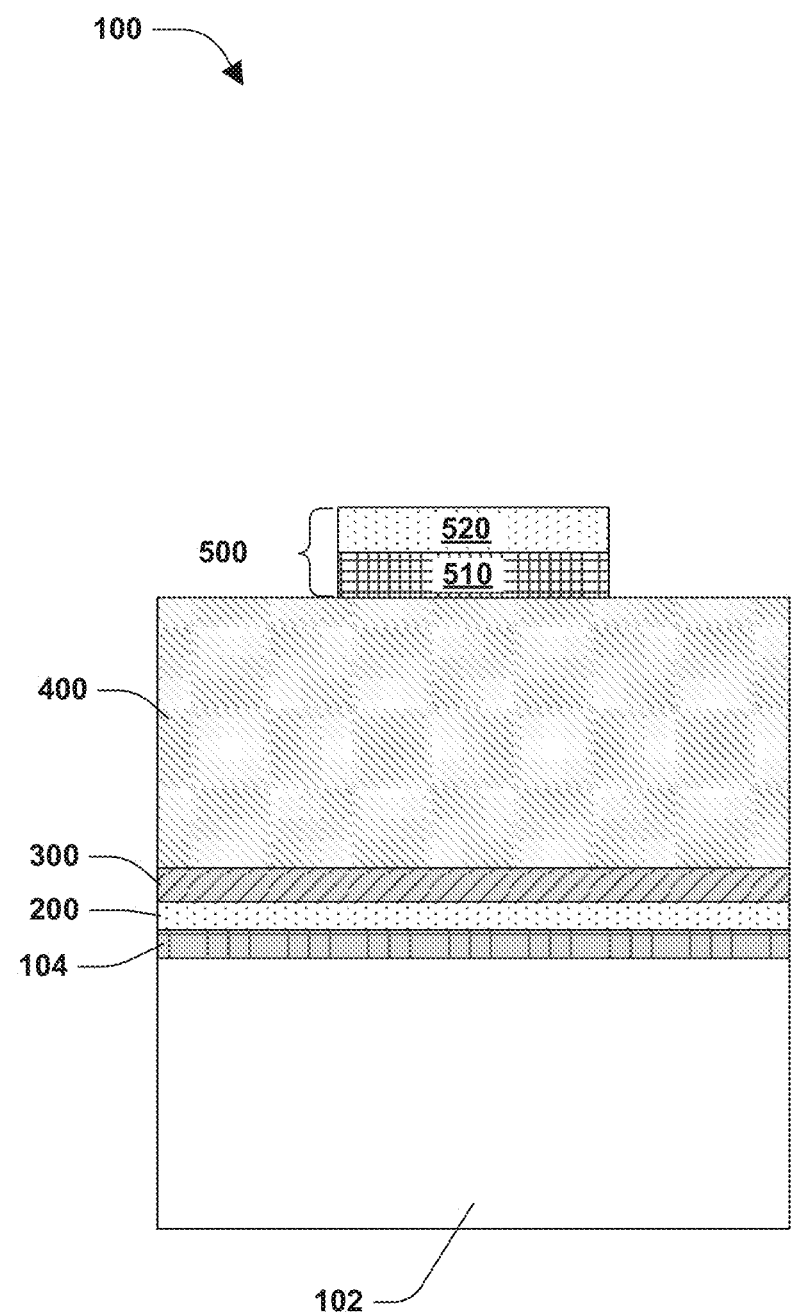
FIG. 9 illustrates a portion of a semiconductor device, according to an embodiment.

Turning now to FIG. 9, in some embodiments, the bottom layer 600 is removed, such as by wet etching, dry etching, etc. In some embodiments, the bottom layer 600 is removed after etching through the BARC layer 610. According to some embodiments, an etch chemistry for etching through the bottom layer 600 includes $CF_4$, $CHF_3$, $CH_2F_2$, $SO_2$, Ar, He, $N_2$, $Cl_2$, etc., alone or in combination. In some embodiments, an etching time for etching through the bottom layer 600 is between about 1 second to about 200 seconds. In some embodiments, an etch pressure for etching through the bottom layer 600 is between about 1 millitorr (mTorr) to about 30 mTorr. In some embodiments, a source wattage for etching through the bottom layer 600 is between about 100 watts to about 2000 watts. In some embodiments, a bias wattage for etching through the bottom layer 600 is between about 0 watts to about 800 watts.

Figure 10:
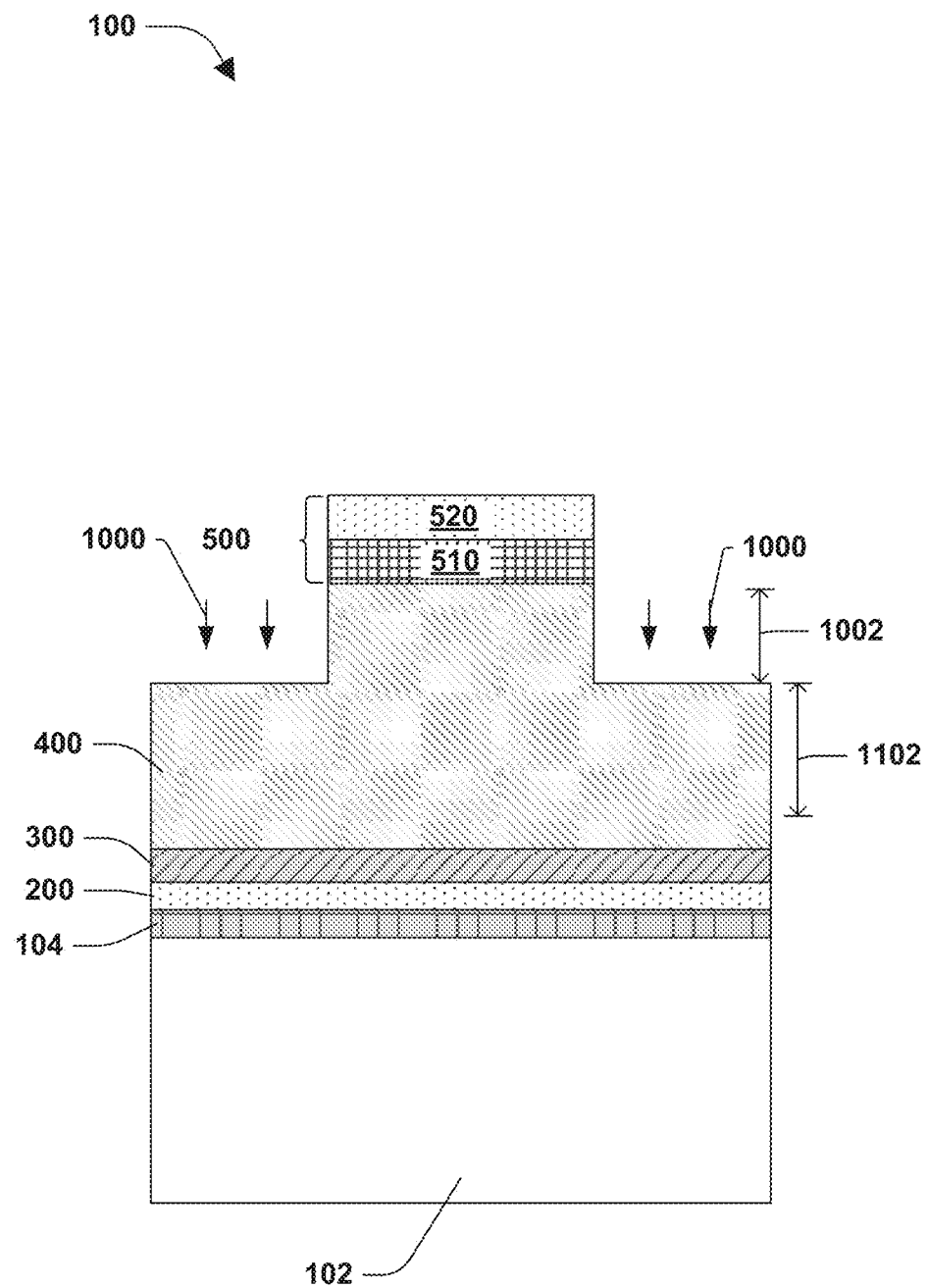
FIG. 10 illustrates a portion of a semiconductor device, according to an embodiment.

Turning now to FIG. 10, in some embodiments, the dummy layer 400 is etched as part of a first dummy layer etching 1000. According to some embodiments, an etch chemistry for etching the dummy layer 400 during the first dummy layer etching 1000 includes $CL_2$, $CF_4$, etc., alone or in combination. In some embodiments, a gas ratio of $CL_2$ to $CF_4$ is about 10 standard cubic centimeters per minute (SCCM) to about 50 SCCM of $CL_2$ to about 100 SCCM to about 150 SCCM of $CF_4$. In some embodiments, an etching time for the first dummy layer etching 1000 is between about 0 seconds to about 50 seconds. In some embodiments, an etch temperature during the first dummy layer etching 1000 is between about 15° Celsius to about 50° Celsius. In some embodiments, the first dummy layer etching 1000 comprises etching through a first depth 1002 of the dummy layer 400 that is between about 400 angstroms to about 600 angstroms.

Figure 11:
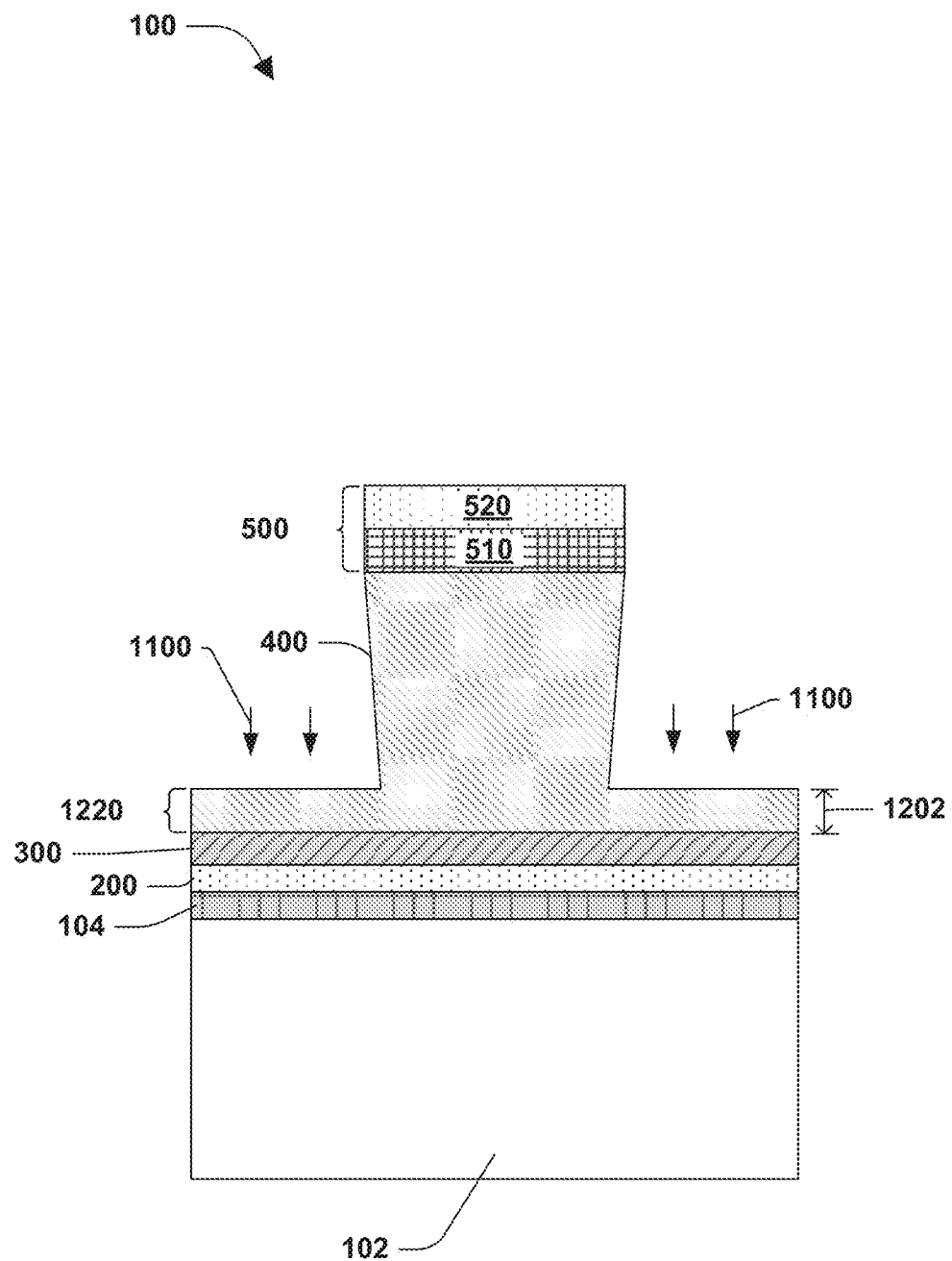
FIG. 11 illustrates a portion of a semiconductor device, according to an embodiment.

Turning now to FIG. 11, in some embodiments, the dummy layer 400 is etched as part of a second dummy layer etching 1100. According to some embodiments, an etch chemistry for etching the dummy layer 400 during the second dummy layer etching 1100 includes $CL_2$, $CF_4$, etc., alone or in combination. In some embodiments, a gas ratio of $CL_2$ to $CF_4$ is about 25 SCCM to about 35 SCCM of $CL_2$ to about 125 SCCM to about 135 SCCM of $CF_4$. In some embodiments, an etching time for the second dummy layer etching 1100 is between about 5 seconds to about 50 seconds. In some embodiments, an etch temperature during the second dummy layer etching 1100 is between about 15° Celsius to about 50° Celsius. In some embodiments, the second dummy layer etching 1100 comprises etching through a second depth 1102 (illustrated in FIG. 10) of the dummy layer 400 that is between about 100 angstroms to about 200 angstroms.

Figure 12:
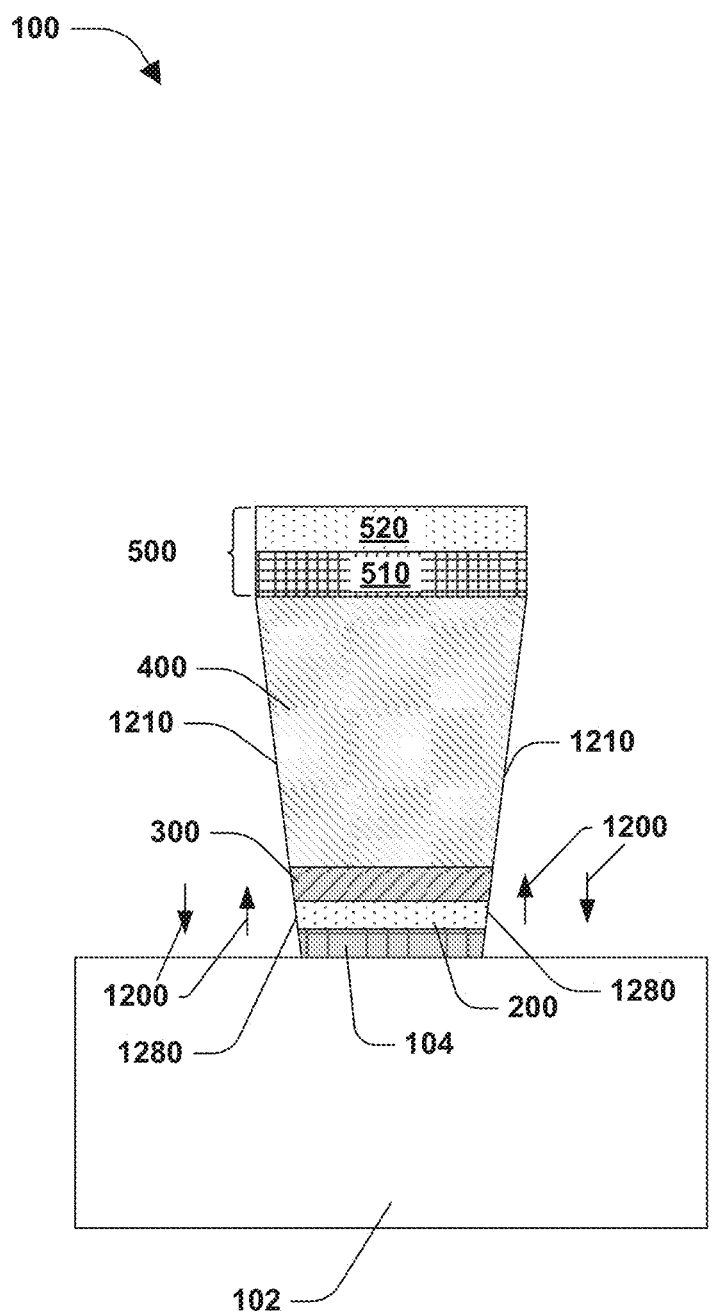
FIG. 12 illustrates a portion of a semiconductor device, according to an embodiment.

Turning now to FIG. 12, in some embodiments, the dummy layer 400, cap layer 300, gate dielectric 200, and interfacial layer 104 are etched as part of a third dummy layer etching 1200. According to some embodiments, an etch chemistry for etching an unetched portion 1220 (illustrated in FIG. 11) of the dummy layer 400 during the third dummy layer etching 1200 includes $CL_2$, $CF_4$, $CHF_3$, HBr, $N_2$, Ar, He, etc., alone or in combination. In some embodiments, a gas ratio of $CL_2$ to $CF_4$ to $CHF_3$ is about 25 SCCM to about 35 SCCM of $CL_2$ to about 60 SCCM to about 80 SCCM of $CF_4$ to about 10 SCCM to about 30 SCCM of $CHF_3$. In some embodiments, an etching time for the third dummy layer etching 1200 is between about 5 seconds to about 50 seconds. In some embodiments, the third dummy layer etching 1200 comprises etching sidewalls 1210 of the dummy layer 400. In some embodiments, the third dummy layer etching 1200 comprises etching through a third depth 1202 (illustrated in FIG. 11) of the dummy layer 400 that is between about 40 angstroms to about 60 angstroms.

In certain embodiments, increasing the gas flow of $CL_2$ in the etching gases for the first dummy layer etching 1000, the second dummy layer etching 1100, or the third dummy layer etching 1200 forms a re-entrant profile for the dummy layer 400 with a sidewall angle that is less than about 90 degrees with respect to the substrate 102.

In some embodiments, the third dummy layer etching 1200 comprises etching through the cap layer 300, gate dielectric 200, and interfacial layer 104. In some embodiments, the third dummy layer etching 1200 for etching through the cap layer 300, gate dielectric 200, and interfacial layer 104 includes the same etch chemistry and properties as the third dummy layer etching 1200. In some embodiments, the third dummy layer etching 1200 for etching through the cap layer 300, gate dielectric 200, and interfacial layer 104 includes a different etch chemistry and properties than for etching through the dummy layer 400. In an embodiment, the etch chemistry for etching through the cap layer 300, gate dielectric 200, and interfacial layer 104 includes $BCL_3$, $CL_2$, $O_2$, $N_2$, Ar, etc., alone or in combination. In some embodiments, an etching time for etching through the cap layer 300, gate dielectric 200, and interfacial layer 104 is between about 5 seconds to about 50 seconds. According to some embodiments, the third dummy layer etching 1200 comprises patterning sidewalls 1280 of the cap layer 300, gate dielectric 200, and interfacial layer 104, such that the sidewalls 1280 form an angle that is not equal to 90 degrees with respect to the substrate 102. Accordingly, in some embodiments, the forming the gate dielectric 200 comprises patterning the sidewalls 1280. As such, in some embodiments, the photoresist layer 620 (illustrated in FIG. 6) is etched before the gate dielectric 200 is formed.

Turning now to FIG. 13, in an embodiment, one or more spacers 1300 are formed surrounding at least one of the dummy layer 400, cap layer 300, gate dielectric 200, or interfacial layer 104. In some embodiments, the one or more spacers 1300 comprises a first spacer portion 1302 and a second spacer portion 1304. In some embodiments, the first spacer portion 1302 of the spacer 1300 is formed on a first side 1310 of the dummy layer 400, cap layer 300, gate dielectric 200, and interfacial layer 104 while the second spacer portion 1304 of the spacer 1300 is formed on a second side 1312. The first spacer portion 1302 and second spacer portion 1304 comprise any number of dielectric materials, such as nitrides, oxides, etc., alone or in combination. The first spacer portion 1302 and second spacer portion 1304 are formed in any number of ways, such as by thermal growth, chemical growth, atomic layer deposition (ALD), chemical vapor deposition (CVD), plasma-enhanced chemical vapor deposition (PECVD), or other suitable techniques, for example. In some embodiments, the first spacer portion 1302 and second spacer portion 1304 are etched, such that a top surface 1320 of the first spacer portion 1302 and second spacer portion 1304 is generally planar with respect to a top surface 1340 of the dummy layer 400.

In some embodiments, the top surface 1340 of the dummy layer 400 is substantially diametrically opposite a bottom surface 1370 of the dummy layer 400. According to some embodiments, the top surface 1340 of the dummy layer 400 is substantially parallel to the bottom surface 1370 of the dummy layer 400. In certain embodiments, a top surface length 1372 of the top surface 1340 is not equal to a bottom surface length 1374 of the bottom surface 1370. In some embodiment, the top surface length 1372 of the top surface 1340 is larger than the bottom surface length 1374 of the bottom surface 1370.

Turning now to FIG. 14, the dummy layer 400, first mask portion 510, and second mask portion 520 are removed, such as by etching. According to some embodiments, an etch chemistry for etching the dummy layer 400, first mask portion 510, and second mask portion 520 includes $CF_4$, $CHF_3$, $Cl_2$, etc., alone or in combination. In some embodiments, an etching time for etching the dummy layer 400, first mask portion 510, and second mask portion 520 is between about 0 seconds to about 50 seconds. In some embodiments, after the dummy layer 400 is removed, an opening 1400 is formed between the first spacer portion 1302 and second spacer portion 1304, and a top surface 1402 of the cap layer 300 is exposed.

In some embodiments, the opening 1400 is defined between the first spacer portion 1302 and second spacer portion 1304 of the spacers 1300. In some embodiments, a top opening length 1450 of the opening 1400 is not equal to a bottom opening length 1452 of the opening 1400. In certain embodiments, the top opening length 1450 of the opening 1400 is larger than the bottom opening length 1452 of the opening 1400.

Turning now to FIG. 15, according to some embodiments, a gate electrode 1500 is formed within the opening 1400 (illustrated in FIG. 14) between the first spacer portion 1302 and second spacer portion 1304 and over the cap layer 300. The gate electrode 1500 is formed in any number of ways, such as by deposition, epitaxial growth, etc., for example. In some embodiments, the gate electrode 1500 includes a conductive material, such as aluminum, copper, etc., alone or in combination. In some embodiments, the gate electrode 1500 comprises a metal gate electrode. In some embodiments, a gate stack 1502 comprises the gate electrode 1500, cap layer 300, gate dielectric 200, and interfacial layer 104, with the gate electrode 1500 over the gate dielectric 200. In some embodiments, the gate stack 1502 comprises a metal gate stack.

In some embodiments, the gate electrode 1500 comprises a first top surface 1510 and a second bottom surface 1512 that is substantially diametrically opposite the first top surface 1510. In some embodiments, the first top surface 1510 is parallel to the second bottom surface 1512. In some embodiments, the second bottom surface 1512 is in closer proximity to the gate dielectric 200 than the first top surface 1510 is to the gate dielectric 200. In some embodiments, the first top surface 1510 comprises a first surface length 1520 and the second bottom surface 1512 comprises a second surface length 1522. In some embodiments, the first surface length 1520 is not equal to the second surface length 1522. In some embodiments, the first surface length 1520 is larger than the second bottom surface length 1522.

In some embodiments, the gate electrode 1500 comprises a third surface 1530 and a fourth surface 1532 that is substantially diametrically opposite the third surface 1530. According to some embodiments, the third surface 1530 is not parallel with respect to the fourth surface 1532.

According to some embodiments, the second bottom surface 1512 is at a first angle 1540 with respect to the third surface 1530. In some embodiments, the first angle 1540 is greater than about 90 degrees. In some embodiments, the second bottom surface 1512 is at a second angle 1542 with respect to the fourth surface 1532. In some embodiments, the second angle 1542 is greater than about 90 degrees. In an embodiment, the first angle 1540 is substantially equal to the second angle 1542.

According to some embodiments, the first top surface 1510 is at a third angle 1550 with respect to the third surface 1530. In some embodiments, the third angle 1550 is less than about 90 degrees. According to some embodiments, the first top surface 1510 is at a fourth angle 1552 with respect to the fourth surface 1532. In some embodiments, the fourth angle 1552 is less than about 90 degrees. In an embodiment, the third angle 1550 is substantially equal to the fourth angle 1552.

In some embodiments, the gate stack 1502 comprises a first sidewall 1560. In an embodiment, the first sidewall 1560 is adjacent to the second spacer portion 1304. In some embodiments, the first sidewall 1560 comprises the third surface 1530 of the gate electrode 1500 and a first surface 1564 of the cap layer 300, gate dielectric 200, and interfacial layer 104. According to some embodiments, the first sidewall 1560 is at a first sidewall angle 1562 with respect to a surface 1590 of the substrate 102 over which the semiconductor device 100 is formed. In some embodiments, the first sidewall angle 1562 is not equal to 90 degrees. In some embodiments, the first sidewall angle 1562 is less than 90 degrees.

In some embodiments, the gate stack 1502 comprises a second sidewall 1570 that is substantially diametrically opposite the first sidewall 1560. In an embodiment, the second sidewall 1570 is adjacent to the first spacer portion 1302. In some embodiments, the second sidewall 1570 is comprises the fourth surface 1532 of the gate electrode 1500 and a second surface 1574 of the cap layer 300, gate dielectric 200, and interfacial layer 104. According to some embodiments, the second sidewall 1570 is at a second sidewall angle 1572 with respect to the surface 1590 of the substrate 102. In some embodiments, the second sidewall angle 1572 is not equal to 90 degrees. In some embodiments, the second sidewall angle 1572 is less than 90 degrees.

FIG. 16 illustrates a second example semiconductor device 1600. According to some embodiments, the second semiconductor device 1600 comprises the dummy layer 400 formed over the substrate 102. According to some embodiments, the second semiconductor device 1600 comprises the mask region 500, first mask portion 510, second mask portion 520, etc.

In some embodiments, the second semiconductor device 1600 comprises the bottom layer 600, BARC layer 610, and photoresist layer 620 (illustrated in FIGS. 6 to 9). As described with respect to FIG. 6, in some embodiments, the bottom layer 600 is formed over the dummy layer 400, the BARC layer 610 is formed over the bottom layer 600, and the photoresist layer 620 is formed over the BARC layer. 610. As described with respect to FIGS. 7 to 9, the bottom layer 600, BARC layer 610, and photoresist layer 620 are removed from the dummy layer 400, such as by etching.

Turning now to FIG. 17, in some embodiments, the dummy layer 400 is etched as part of the first dummy layer etching 1000. In some embodiments, the first dummy layer etching 1000 comprises etching through the first depth 1002 of the dummy layer 400. In FIG. 18, according to some embodiments, the dummy layer 400 is etched as part of the second dummy layer etching 1100. According to some embodiments, the second dummy layer etching 1100 comprises etching through the second depth 1102 (illustrated in FIG. 17).

Turning to FIG. 19, in some embodiments, the dummy layer 400 is etched as part of the third dummy layer etching 1200. According to some embodiments, as a result of the third dummy layer etching 1200, the unetched portion 1220 of the dummy layer 400 (illustrated in FIG. 18) is removed and the sidewalls 1210 of the dummy layer 400 are etched.

In some embodiments, the top surface 1340 of the dummy layer 400 is substantially diametrically opposite the bottom surface 1370 of the dummy layer 400. According to some embodiments, the top surface 1340 of the dummy layer 400 is substantially parallel to the bottom surface 1370 of the dummy layer 400. In certain embodiments, the top surface length 1372 of the top surface 1340 is not equal to the bottom surface length 1374 of the bottom surface 1370. In some embodiment, the top surface length 1372 of the top surface 1340 is larger than the bottom surface length 1374 of the bottom surface 1370.

In FIG. 20, in an embodiment, the spacer 1300, comprising the first spacer portion 1302 and second spacer portion 1304, is formed surrounding the dummy layer 400. In some embodiments, the first spacer portion 1302 is formed on the first side 1310 of the dummy layer 400 while the second spacer portion 1304 is formed on the second side 1312. In FIG. 21, the dummy layer 400 is removed, such as by etching. In some embodiments, after the dummy layer 400 is removed, the opening 1400 is formed between the first spacer portion 1302 and second spacer portion 1304.

In some embodiments, the opening 1400 is defined between the first spacer portion 1302 and second spacer portion 1304 of the spacers 1300. In some embodiments, the top opening length 1450 of the opening 1400 is not equal to the bottom opening length 1452 of the opening 1400. In certain embodiments, the top opening length 1450 of the opening 1400 is larger than the bottom opening length 1452 of the opening 1400.

Turning to FIG. 22, according to some embodiments, the interfacial layer 104 is formed within the opening 1400. In some embodiments, the interfacial layer thickness 106 of the interfacial layer 104 is between about 5 angstroms to about 20 angstroms. According to some embodiments, the gate dielectric 200 is formed over the interfacial layer 104 and over the substrate 102. In an embodiment, the gate dielectric 200 is formed within the opening 1400 between the first spacer portion 1302 and the second spacer portion 1304 of the spacers 1300. In some embodiments, the gate dielectric thickness 202 of the gate dielectric 200 is between about 5 angstroms to about 30 angstroms. Although not illustrated in FIG. 3, according to some embodiments, the cap layer 300 is formed over the gate dielectric 200.

Turning now to FIG. 23, in an embodiment, the gate electrode 1500 is formed within the opening (illustrated in FIG. 22) between the first spacer portion 1302 and second spacer portion 1304 and over the gate dielectric 200. In some embodiments, the gate stack 1502 comprises the gate electrode 1500, gate dielectric 200, and interfacial layer 104.

In some embodiments, the gate electrode 1500 comprises the first top surface 1510 and the second bottom surface 1512 that is substantially diametrically opposite the first top surface 1510. In some embodiments, the first top surface 1510 is parallel to the second bottom surface 1512. In some embodiments, the second bottom surface 1512 is in closer proximity to the gate dielectric 200 than the first top surface 1510. In some embodiments, the first top surface 1510 comprises the first surface length 1520 and the second bottom surface 1512 comprises the second surface length 1522. In some embodiments, the first surface length 1520 is not equal to the second surface length 1522. In some embodiments, the first surface length 1520 is larger than the second surface length 1522.

In some embodiments, the gate electrode 1500 comprises the third surface 1530 and the fourth surface 1532 that is substantially diametrically opposite the third surface 1530. According to some embodiments, the third surface 1530 is not parallel with respect to the fourth surface 1532.

According to some embodiments, the second bottom surface 1512 is at the first angle 1540 with respect to the third surface 1530. In some embodiments, the first angle 1540 is greater than about 90 degrees. In some embodiments, the second bottom surface 1512 is at the second angle 1542 with respect to the fourth surface 1532. In some embodiments, the second angle 1542 is greater than about 90 degrees. In an embodiment, the first angle 1540 is substantially equal to the second angle 1542.

According to some embodiments, the first top surface 1510 is at the third angle 1550 with respect to the third surface 1530. In some embodiments, the third angle 1550 is less than about 90 degrees. According to some embodiments, the first top surface 1510 is at the fourth angle 1552 with respect to the fourth surface 1532. In some embodiments, the fourth angle 1552 is less than about 90 degrees. In an embodiment, the third angle 1550 is substantially equal to the fourth angle 1552.

In some embodiments, the gate stack 1502 comprises the first sidewall 1560. In an embodiment, the first sidewall 1560 is adjacent to the second spacer portion 1304. In some embodiments, the first sidewall 1560 comprises the third surface 1530 of the gate electrode 1500 and the first surface 1564 of the gate dielectric 200 and interfacial layer 104. According to some embodiments, the first sidewall 1560 is at the first sidewall angle 1562 with respect to the surface 1590 of the substrate 102 over which the semiconductor device 100 is formed. In some embodiments, the first sidewall angle 1562 is not equal to 90 degrees. In some embodiments, the first sidewall angle 1562 is less than 90 degrees.

In some embodiments, the gate stack 1502 comprises the second sidewall 1570 that is substantially diametrically opposite the first sidewall 1560. In an embodiment, the second sidewall 1570 is adjacent to the first spacer portion 1302. In some embodiments, the second sidewall 1570 is comprises the fourth surface 1532 of the gate electrode 1500 and the second surface 1574 of the gate dielectric 200 and interfacial layer 104. According to some embodiments, the second sidewall 1570 is at the second sidewall angle 1572 with respect to the surface 1590 of the substrate 102. In some embodiments, the second sidewall angle 1572 is not equal to 90 degrees. In some embodiments, the second sidewall angle 1572 is less than 90 degrees.

According to some embodiments, the semiconductor device 100, 1600 includes the gate electrode 1500 of the gate stack 1502 having the first top surface 1510 and the second bottom surface 1512. In some embodiments, the first surface length 1520 of the first top surface 1510 is not equal to the second surface length 1522 of the second bottom surface 1512. In some embodiments, due to the first surface length 1520 not being equal to the second surface length 1522, the semiconductor device 100, 1600 exhibits a reduced number of defects in the gate electrode 1500. Additionally, according to some embodiments, the semiconductor device 100, 1600 exhibits improved uniformity performance.

In an embodiment, a semiconductor device, such as semiconductor device 100, 1600, comprises a metal gate stack 1502 comprising a high-k gate dielectric 200 and a metal gate electrode 1500 over the high-k gate dielectric 200. In an embodiment, the metal gate electrode 1500 comprises a first top surface 1510 and a second bottom surface 1512 substantially diametrically opposite the first top surface 1510. In an embodiment, the first top surface 1510 comprises a first surface length 1520 and the second bottom surface 1512 comprises a second surface length 1522. In an embodiment, the first surface length 1520 is larger than the second surface length 1522.

An example method 2400 of forming a semiconductor device, such as semiconductor device 100, 1600, according to some embodiments, is illustrated in FIG. 24. At 2402, the gate dielectric 200 is formed. At 2404, a silicon dummy layer 400 is formed over the gate dielectric 200 such that a top surface 1340 of the silicon dummy layer 400 is substantially diametrically opposite a bottom surface 1370 of the silicon dummy layer 400, and such that a top surface length 1372 of the top surface 1340 is not equal to a bottom surface length 1374 of the bottom surface 1370. At 2406, the silicon dummy layer 400 is replaced with a metal gate electrode 1500.

An example method 2500 of forming a semiconductor device, such as semiconductor device 100, 1600, according to some embodiments, is illustrated in FIG. 25. At 2502, a silicon dummy layer 400 is formed over a substrate 102 such that a top surface 1340 of the silicon dummy layer 400 is substantially diametrically opposite a bottom surface 1370 of the silicon dummy layer 400, and such that a top surface length 1372 of the top surface 1340 is not equal to a bottom surface length 1374 of the bottom surface 1370. At 2504, spacers 1300 are formed on a first side 1310 and a second side 1312 of the silicon dummy layer 400. At 2506, the silicon dummy layer 400 is removed to define an opening 1400 between the spacers 1300 such that a top opening length 1450 of the opening 1400 is not equal to a bottom opening length 1452 of the opening 1400. At 2508, a gate dielectric 200 is formed within the opening 1400 between the spacers 1300 over the substrate 102. At 2510, a metal gate electrode 1500 is formed over the gate dielectric 200 between the spacers 1300 such that a first top surface 1510 of the metal gate electrode 1500 is substantially diametrically opposite a second bottom surface 1512 of the metal gate electrode 1500, and such that a first surface length 1520 of the first top surface 1510 is not equal to a second surface length 1522 of the second bottom surface 1512.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first spacer portion and a second spacer portion generally correspond to first spacer portion A and second spacer portion B or two different or two identical spacer portions or the same spacer portion.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
   forming a gate dielectric;
   forming a silicon dummy layer over the gate dielectric;
   performing a first etch using a first etch chemistry to etch through a first portion of the silicon dummy layer;
   performing a second etch using a second etch chemistry to etch through a second portion of the silicon dummy layer, the second etch chemistry different than the first etch chemistry;
   performing a third etch using a third etch chemistry to concurrently etch through a third portion of the silicon dummy layer and a portion of the gate dielectric to taper a sidewall of the gate dielectric and a sidewall of the silicon dummy layer such that a top surface length of a top surface of the silicon dummy layer is not equal to a bottom surface length of a bottom surface of the silicon dummy layer and a top surface length of a top surface of the gate dielectric is not equal to a bottom surface length of a bottom surface of the gate dielectric; and
   replacing the silicon dummy layer with a metal gate electrode.

2. The method of claim 1, comprising etching through a photoresist layer before forming the gate dielectric.

3. The method of claim 2, comprising removing a BARC layer after etching through the photoresist layer.

4. The method of claim 3, comprising removing a bottom layer after removing the BARC layer.

5. The method of claim 1, wherein the second etch tapers a first portion of the sidewall of the silicon dummy layer and the third etch tapers a second portion of the sidewall of the silicon dummy layer.

6. The method of claim 1, wherein the third etch is stopped when the sidewall of the gate dielectric and the sidewall of the silicon dummy layer lie in a same plane.

7. The method of claim 1, comprising forming a cap layer over the gate dielectric before the forming a silicon dummy layer.

8. A method of forming a semiconductor device, comprising:
   performing a first etch process to etch through a first portion of a silicon dummy layer;
   performing a second etch process to etch through a second portion of the silicon dummy layer, wherein the second etch process tapers a first portion of a sidewall of the silicon dummy layer; and
   performing a third etch process to etch through a third portion of the silicon dummy layer, wherein:
      the third etch process further etches a portion of a gate dielectric underlying the silicon dummy layer,
      the third etch process tapers a second portion of the sidewall of the silicon dummy layer different than the first portion of the sidewall, and
      the first portion of the sidewall and the second portion of the sidewall together define a tapered sidewall of the silicon dummy layer;
   forming a sidewall spacer adjacent the tapered sidewall of the silicon dummy layer, wherein a sidewall of the sidewall spacer conforms to the tapered sidewall of the silicon dummy layer; and replacing the silicon dummy layer with a metal gate electrode, wherein a sidewall of the metal gate electrode conforms to the sidewall of the sidewall spacer.

9. The method of claim 8, the first etch process comprising a first flow rate of $Cl_2$ and the second etch process comprising a second flow rate of $Cl_2$ different than the first flow rate of $Cl_2$.

10. The method of claim 8, the first etch process comprising a first flow rate of $CF_4$ and the second etch process comprising a second flow rate of $CF_4$ different than the first flow rate of $CF_4$.

11. The method of claim 10, the third etch process comprising a third flow rate of $CF_4$ different than the first flow rate of $CF_4$ and different than the second flow rate of $CF_4$.

12. The method of claim 8, the third etch process comprising $CHF_3$.

13. The method of claim 8, wherein the portion of the gate dielectric comprises a sidewall of the gate dielectric and the third etch process tapers the sidewall of the gate dielectric to define a tapered sidewall of the gate dielectric.

14. The method of claim 13, wherein the third etch process is stopped when the sidewall of the gate dielectric and the sidewall of the silicon dummy layer lie in a same plane.

15. The method of claim 8, comprising:
forming a capping layer over the gate dielectric; and
forming the silicon dummy layer over the capping layer.

16. The method of claim 15, wherein the third etch process further etches a portion of the capping layer.

17. A method of forming a semiconductor device, comprising:
forming a gate dielectric;
forming a capping layer over the gate dielectric;
forming a silicon dummy layer over the capping layer;
performing a first etch process to etch through a first portion of the silicon dummy layer;
performing a second etch process to etch through a second portion of the silicon dummy layer, the second etch process different than the first etch process;
performing a third etch process to concurrently etch through a third portion of the silicon dummy layer and a portion of the capping layer to taper a sidewall of the capping layer and a sidewall of the silicon dummy layer; and
replacing the silicon dummy layer with a metal gate electrode.

18. The method of claim 17, wherein the third etch process further etches a portion of the aate dielectric.

19. The method of claim 17, the first etch process comprising a first flow rate of $Cl_2$ and the second etch process comprising a second flow rate of $Cl_2$ different than the first flow rate of $Cl_2$.

20. The method of claim 17, the first etch process comprising a first flow rate of $CF_4$ and the second etch process comprising a second flow rate of $CF_4$ different than the first flow rate of $CF_4$.

* * * * *

UNITED STATES PATENT AND TRADEMARK OFFICE
CERTIFICATE OF CORRECTION

PATENT NO. : 9,520,474 B2  Page 1 of 1
APPLICATION NO. : 14/024848
DATED : December 13, 2016
INVENTOR(S) : Che-Cheng Chang et al.

It is certified that error appears in the above-identified patent and that said Letters Patent is hereby corrected as shown below:

In the Claims

Column 14, Line 20, Claim 18, please delete "aate" and insert therefor --gate--.

Signed and Sealed this
Twenty-third Day of May, 2017

Michelle K. Lee
*Director of the United States Patent and Trademark Office*